United States Patent [19]

Katz et al.

[11] Patent Number: 5,038,113

[45] Date of Patent: Aug. 6, 1991

[54] NONLINEARITY GENERATOR USING FET SOURCE-TO-DRAIN CONDUCTIVE PATH

[75] Inventors: Allen Katz, West Windsor Township, Mercer County; Shabbir S. Moochalla, South Brunswick Township, Middlesex County, both of N.J.

[73] Assignee: General Electric Company, East Windsor, N.J.

[21] Appl. No.: 443,681

[22] Filed: Dec. 1, 1989

[51] Int. Cl.[5] .............................................. H03F 3/16
[52] U.S. Cl. ...................................... 330/277; 307/497
[58] Field of Search ..................... 307/491, 494, 497; 333/1.1; 330/107, 110, 149, 151, 277, 286, 296

[56] References Cited

U.S. PATENT DOCUMENTS

| | | | |
|---|---|---|---|
| 3,917,964 | 11/1975 | Carlson | 330/277 X |
| 4,109,212 | 8/1978 | Donnell et al. | 328/163 |
| 4,152,666 | 5/1979 | Kajikawa et al. | 330/286 X |
| 4,167,681 | 9/1979 | Wolkstein et al. | 307/237 |
| 4,342,967 | 8/1982 | Regan et al. | 330/277 |
| 4,342,968 | 8/1982 | Ritter | 330/295 |
| 4,465,980 | 8/1984 | Huang et al. | 330/149 |
| 4,588,958 | 5/1986 | Katz et al. | 330/149 |
| 4,630,011 | 12/1986 | Neidert et al. | 333/164 |
| 4,835,421 | 5/1989 | Khoury et al. | 307/497 X |
| 4,843,358 | 6/1989 | Meise et al. | 333/263 |
| 4,893,035 | 1/1990 | Reynolds et al. | 307/520 |

FOREIGN PATENT DOCUMENTS

0034650 3/1977 Japan .................................. 330/286

OTHER PUBLICATIONS

"Design Better AGC FET Amplifiers", by Farell, published at pp. 66–71 of Electronic Design Magazine, Sep. 1, 1967.
1973 Siliconix Application Note entitled "FET's as Voltage-Controlled Resistors", authored by Capella.
Application Note entitled "FET's As Voltage-Controlled Resistors", by Sherwin, pp. 12–14, Aug. 1965 issue of SSD/CDE Periodical.
Undated article entitled "Linearization Techniques For Travelling Wave Tube And Solid State Power Amplifiers", by Kumar, published by David Sarnoff Research Center.
"Low Cost, Low Drain, High Speed, Wideband GaAs MMIC Switches", by Fryklund et al. Dec. 985 issue of Microwave Journal.
"Characterization of Linear and Nonlinear Properites of GaAs MESFET's for Broad–Band Control Applications", by Gutmann et al., pp. 81–91 of IEEE Transactions on Microwave Theory and Techniques, vol. MTT-35, No. 5, May 1987.

*Primary Examiner*—Steven Mottola
*Attorney, Agent, or Firm*—William H. Meise

[57] ABSTRACT

A distortion generator uses the source-to-drain conductive path of a FET as the nonlinear element, in either a reflective or transmissive mode. In the reflective mode, the signal is applied across the source-to-drain conductive path, and in the transmissive mode the source-to-drain conductive path is in series with the transmission path. The FET may be biased, and the gate impedance to reference potential aids in selecting the nonlinearity characteristic. Reflective embodiments of a predistortion equalizer include a circulator version and a 3 dB hybrid splitter version. Transmissive embodiments include a direct series embodiment, and another with a 3 dB splitter and a separator combiner. Limiter and log-amp uses are described.

34 Claims, 17 Drawing Sheets

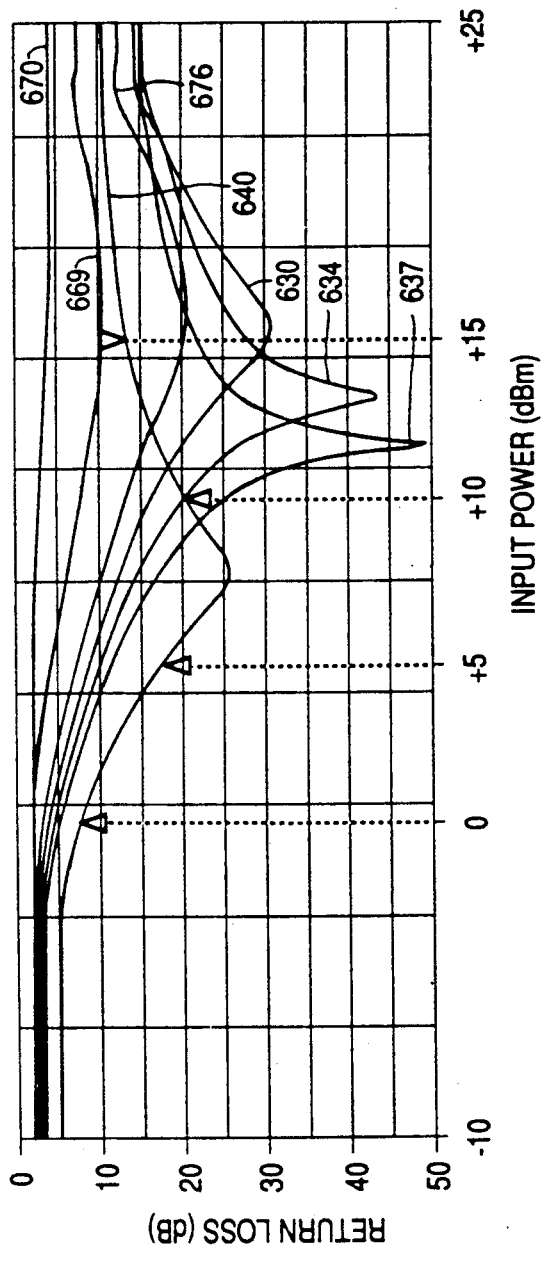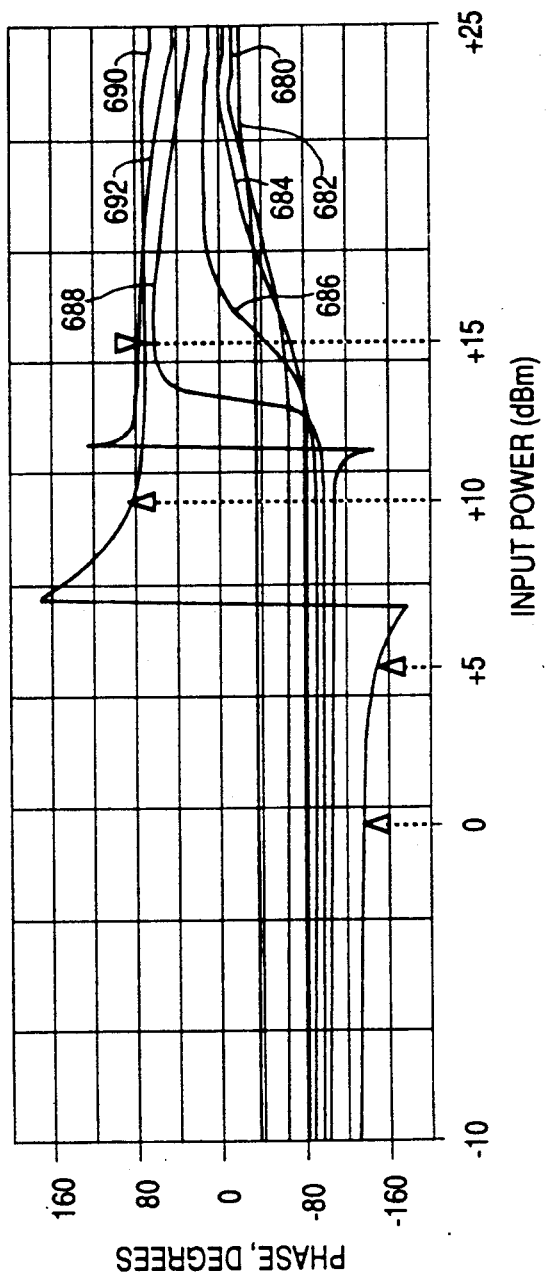

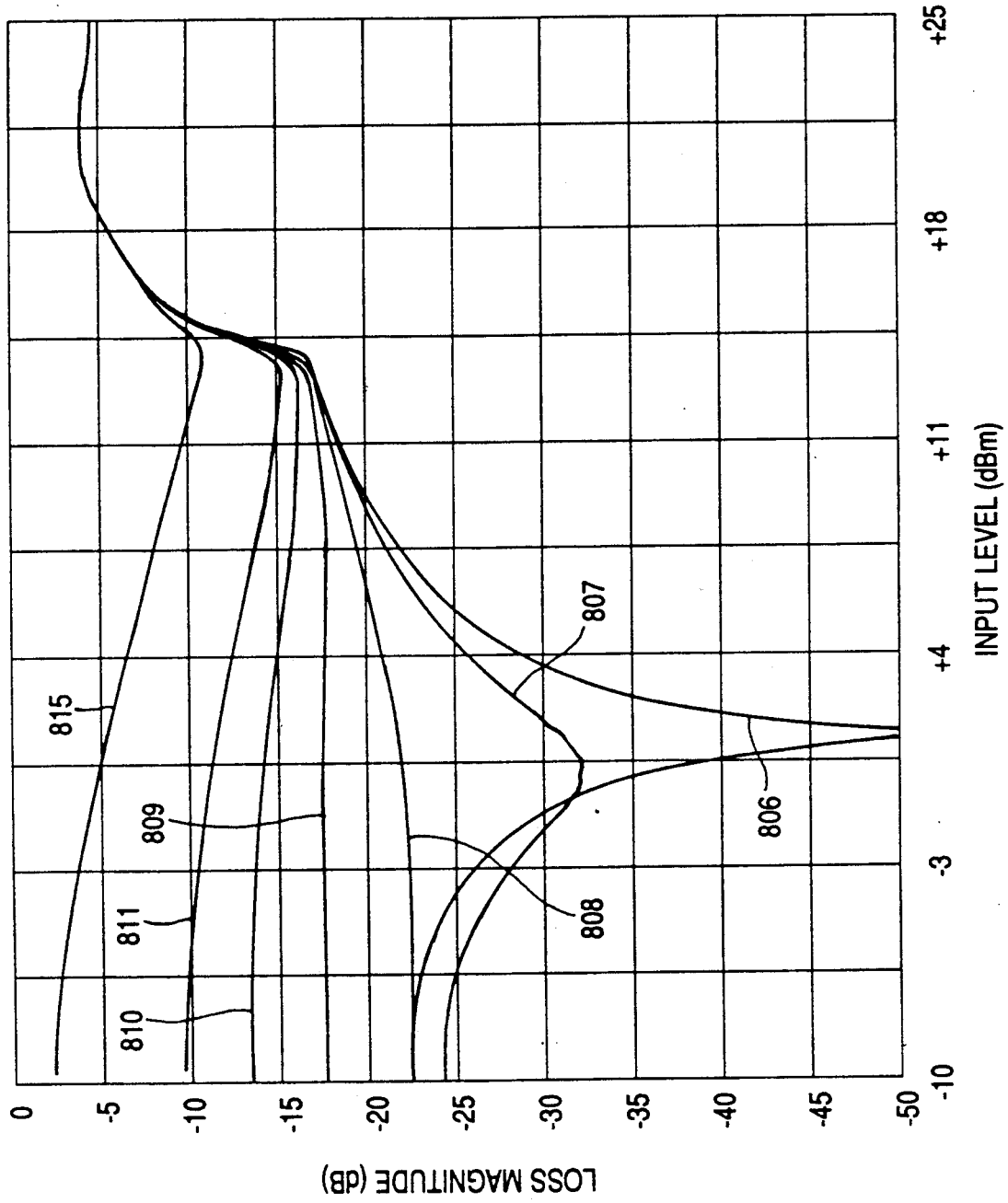

NONLINEARITY GENERATOR USING FET SOURCE-TO-DRAIN CONDUCTIVE PATH

This invention relates to generation of distortion by use of source-to-drain conductive path of a field-effect transistor (FET), and to the use of such distortion generator at microwave or millimeter-wave (radio) frequencies (RF) for such uses as predistortion circuits for compensating amplitude and phase distortion of power amplifiers, limiters and logarithmic converters (log amps).

Electronic signal amplifiers are used to increase a voltage, current or power of electrical signals. Ideally, amplifiers merely increase the signal amplitude without affecting the signal in any other way. However, all signal amplifiers distort the signal being amplified. The distortion results from nonlinearity of the transfer function or characteristic of the active devices of the amplifier. The distortion of a signal passing through an amplifier can be reduced by keeping the peak-to-peak signal amplitude small, and by operating the amplifier so that the signal traverses the central part of its transfer characteristic, at which it is most linear. However, there are certain situations in which it is necessary for the output signal excursion to extend over a substantial part of the amplifier transfer function. This is true in the case of radio and television broadcast transmitters, where such operation is important in order to obtain the maximum possible output power from each costly amplifier. This condition also exists in the case of microwave or millimeter-wave frequency (Radio Frequency or RF) amplifiers for satellite communications, because the ability of the active devices to operate at RF requires a structure which allows them to be operated only at relatively moderate voltage and current bias levels, so that the signal swing constitutes a significant portion of the available bias, and therefore of the overall transfer function of the amplifier. When the output signal swing of an amplifier makes excursions over substantial portions of the transfer function, the usual effect is a relative compression of large signals by comparison with small signals, i.e. the gain of the amplifier at large signal levels tends to be less than the gain at low signal levels. For the case of a sinusoidal signal viewed or an oscilloscope, the compressed output signal is a sinusoid generally similar in appearance to the input signal, but with a somewhat flattened top and bottom. A phase shift often accompanies amplitude distortion. Radio frequency amplifiers are often used to amplify a plurality of signals, as in multichannel satellite operations. When multiple signals are amplified, the peak signal values occasionally become superposed, causing sum excursions with large peak-to-peak values. In the case of multichannel signals, compression may not be as easy a measurement to make as intermodulation distortion measurements. Intermodulation distortion measurements are ordinarily made by measuring the relative amount of unwanted products which accompany one of the carriers, which for test purposes is generally itself unmodulated.

Predistortion of a signal which is to be applied to a nonlinear amplifier is often performed in order to precompensate for the expected distortion caused by the amplifier's nonlinearity. Among the problems which arise in the design of predistortion circuits is that of finding a nonlinear device and corresponding circuit configuration which together have a gain which increases with increasing level, and which will therefore compensate for the decrease in gain caused by the amplifier nonlinearity. This problem lies in the matching of the nonlinearity of the nonlinear device to that of the amplifier both in amplitude and in phase. That is, the increase in gain and change in phase with increasing signal level due to predistortion must substantially cancel the decrease in gain and oppositely-directed change in phase with increasing level attributable to the amplifier. If the system with which the predistortion equalizer is used will be operated at various power levels, the matching of nonlinearity must occur over the desired range of values.

FIG. 1a is a simplified block diagram of a typical prior art reflective predistortion equalizer. In FIG. 1a, signals to be predistorted are applied by way of an input terminal 10 to a first input port 12 of a 90°, 3 dB hybrid coupler 14. Signals with nominally zero phase shift are coupled from directional coupler 14 by way of an output port 16 to a nonlinear network designated generally as 18, which includes a short-circuited attenuator and phase shifter illustrated together as a block 20. The nonlinearity is provided by a distortion generator, designated generally as 22. The particular form of distortion generator illustrated in FIG. 1A is a pair of antiphase or antiparallel diodes 24, 26 as known in the art, for example, from U.S. Pat. No. 4,588,958, issued May 13, 1986, to Katz et al. Such antiparallel diodes are advantageous by virtue of simplicity, low cost and reliability. Signals applied to input port 12 are also coupled with a nominal 9020 phase shift to an output port 28 for application to a linear channel designated generally as 30, which includes the cascade of a variable attenuator 32 and a short-circuited phase shifter 34. Signals applied to input terminal 12 are coupled into nonlinear channel 18 and into linear channel 30, are processed and reflected, and are coupled together and to an output port 36. As discussed below in relation to FIG. 5b, the impedance of antiparallel diode pairs varies significantly as a function of frequency, temperature and power level, with the result that matching networks must be designed for a compromise impedance value. The antiparallel diodes tend not to track well over frequency, power level and temperature. Also, the antiparallel diodes tend to be difficult to adjust.

FIG. 1b is a simplified block diagram of a transmissive predistortion equalizer. In FIG. 1b, signals to be predistorted are applied by way of an input port 50 to a 3 dB hybrid splitter or coupler 52, which divides the signal into a first portion which is applied to a linear upper transmission path designated generally as 54, and a second portion which is applied to a nonlinear lower transmission path designated generally as 64. Linear path 54 includes the cascade of a controllable phase shifter 56 and a controllable attenuator 58. The attenuated and phase shifted signals produced at the output of linear channel 54 are applied to a first input port 60 of a 3 dB hybrid combiner 62. Lower nonlinear channel 64 includes the cascade of a controllable phase shifter 66 and a distortion generator 68. The phase shifted and distortion-added signal at the output of nonlinear channel 64 is applied to a second input port 70 of 3 dB hybrid combiner 62 for producing at output port 72 of 3 dB hybrid 62 the combination of a linear and nonlinear signal for application to a power amplifier connected to output port 72. Distortion generator 68 may be a diode generator such as is illustrated in FIG. 1a if sufficient input power is available, or it may include an amplifier which tends to saturate at the operating signal levels, as known in the art. The antiparallel diode pair has the disadvantages listed above, and the amplifier has the added disadvantages of cost, complexity, power consumption and weight.

An improved form of predistortion equalizer is desired, in which the distortion nonlinearity is readily matched to the amplifier, both in amplitude and in phase, which is inexpensive, simple and reliable.

SUMMARY OF THE INVENTION

A distortion circuit according to the invention uses as a distortion generator the source-to-drain conductive path of a field-effect transistor (FET). In one embodiment of the invention, the signal is applied across the source-to-drain conductive path, and the distorted signal is similarly taken from across the source and drain. In another embodiment of the invention, the linear signal is applied to the series combination of the source-to-drain conductive path and the load which utilizes the distortion signal.

DESCRIPTION OF THE DRAWING

FIGS. 6c and 6d are plots of reflection coefficient magnitude and phase with gate reactance as a parameter;

FIG. 8 is a plot of the relative magnitude of transmission or loss of the arrangement of FIG. 7 at 1600 MHz versus signal input level, with gate reactance as a parameter;

FIGS. 17b, 17c, 17d and 17e illustrate ancillary circuits which may be used in the arrangement of FIG. 17a;

DESCRIPTION OF THE INVENTION

Figure 1A:
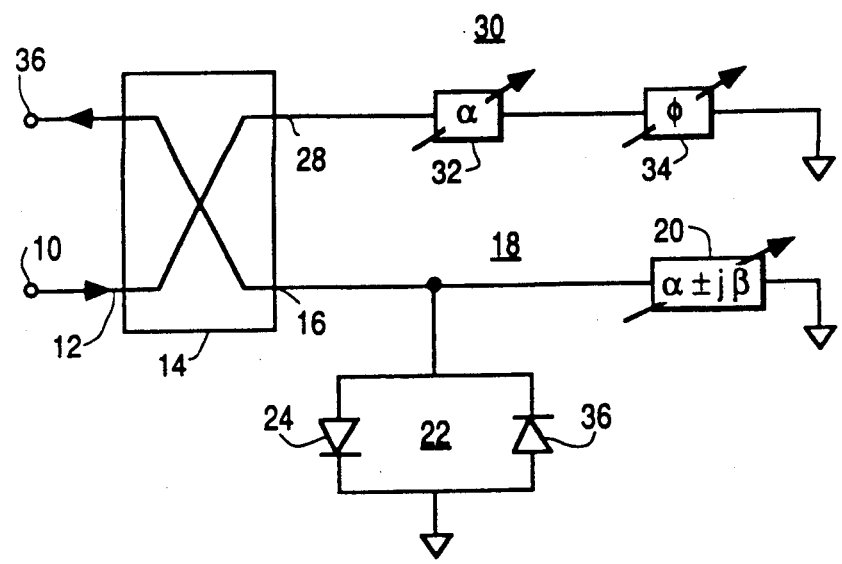
FIG. 1a is a simplified block diagram of a prior art reflective predistortion linearizer or equalizer using an antiparallel diode pair as the nonlinear element.
Figure 1B:
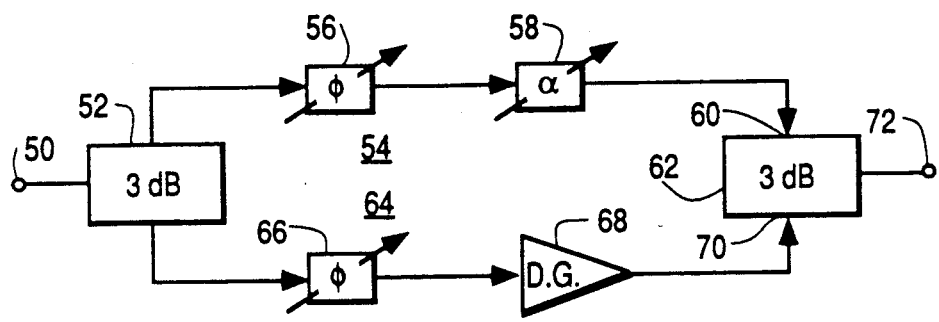
FIG. 1b is a simplified schematic diagram of a transmissive predistortion equalizer using an amplifier as the nonlinear element.
Figure 2:
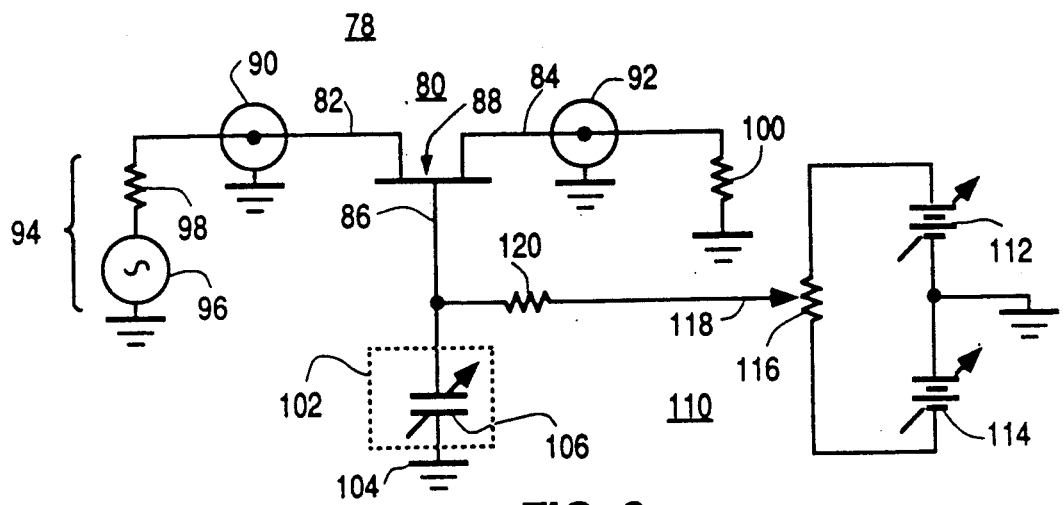
FIG. 2 is a schematic diagram of a FET coupled as a predistortion linearizer, limiter or logarithmic converter in a transmissive arrangement.

FIG. 2 is a schematic diagram of a predistortion equalizer 78 according to the invention. Predistortion equalizer 78 uses a field-effect transistor (FET) 80 including a source or drain electrode 82, drain or source electrode 84, and gate electrode 86, with a source-to-drain conductive path designated 88 therebetween. Conductive path 88 is connected between an input port 90 and an output port 92 to which a generator 94 and a load 100, respectively, are connected. Generator 94 includes a source 96 of alternating voltage (known as "AC"), and also includes an internal impedance illustrated as 98.

A source of bias designated generally as 110 includes first and second voltage sources illustrated as batteries 112 and 114 having their negative and positive terminals, respectively, connected to ground, and their other terminals connected to opposite ends of a potentiometer 116, the wiper 118 of which is connected by way of an isolating element illustrated as a resistor 120 to gate electrode 86. As so far described, the arrangement of FIG. 2 is all that is necessary to accomplish predistortion of a signal applied to input port 90 to generate a predistorted signal at output port 92 for application to a load, such as the input port of a power amplifier (not illustrated). No direct-voltage bias of source or drain electrodes of FET 80 is needed, although application of voltage across the gate-to-conductive-path 88 junction of the FET requires a direct-current connection or its equivalent, at least between one of drain or source electrodes 82, 84 and a point of reference potential.

It has been discovered that additional control of the magnitude and/or phase of the distortion may be achieved by appropriate selection of the gate-to-ground impedance (R±JX). Those skilled in the art recognize that the arrangement as so far described in conjunction with FIG. 2 has a gate-to-ground impedance which is established by the impedance to AC of bias source 100, and in particular by that portion of bias source 100 including resistor 120 and potentiometer 116. Further control of the distortion is provided by an ancillary impedance or matching network illustrated as a dotted block 102 connected between gate 86 and ground, which in general may be any circuit, however complex. In FIG. 2, impedance 102 is illustrated as being a variable capacitor. At RF, the physical dimensions in wavelengths of the variable capacitor may be such as to introduce a substantial inductive component of reactance, whereby the variable capacitor acts as though it were a series-resonant circuit. The distortion provided by predistortion equalizer 78 of FIG. 2 varies with both bias voltage and gate-to-ground impedance.

Figure 3A:
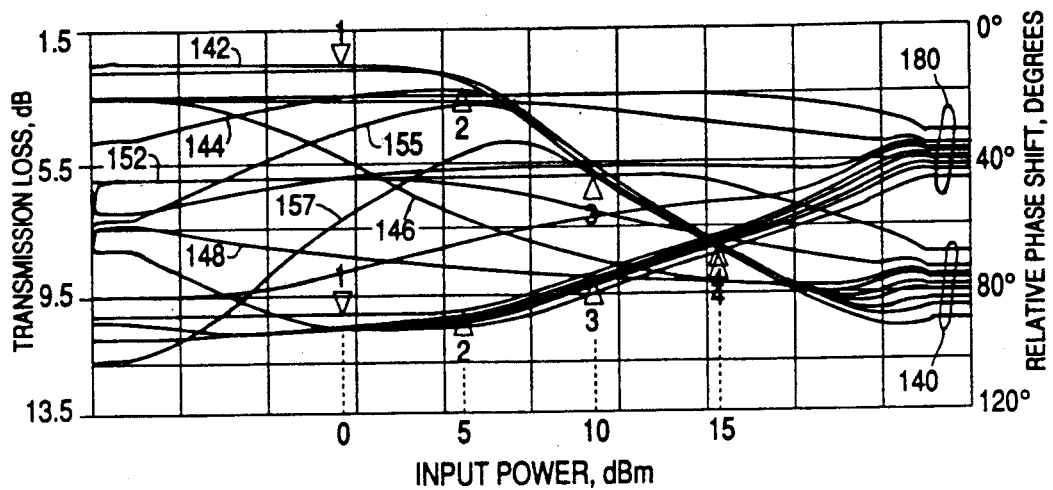
FIGS. 3a and 3b are plots of transmission amplitude and phase, respectively, versus signal power level for the structure of FIG. 2, with bias voltage as a parameter.

FIG. 3a includes plots at 3 GHz of amplitude and phase versus signal power level between ports 90 and 92 of the structure of FIG. 2, with bias voltage as a parameter. The specific circuit for which the plots of FIG. 3a were made includes a gallium arsenide (GaAs) MESFET (MEtal Semiconductor FET), type FSX03FA, manufactured by Fujitsu, whose address is 6-1 Murunouchi 1-Chome, Chiyoda-ky, Tokyo 100, Japan. For the particular plots illustrated in FIG. 3a, electrode 82 of FIG. 2 was the drain and electrode 84 was the source, resistor 120 had a value of 470 ohms, and the capacitance of capacitor 106 was approximately 2 pF. In FIG. 3a, the transmission loss is plotted along the left ordinate, and phase along the right ordinate. Reference marker arrows 1, 2, 3, and 4 correspond to signal input power levels of 0, 5, 10 and 15 dB relative to one milliwatt (dBm). In FIG. 3a, loss curves are designated generally as 140, among which 142 is at a gate bias voltage of zero volts, plot 144 is at +0.5 volts, 146 is at −0.5 volts, 148 is at +0.8 volts, 152 is at −2.0 volts, 155 is at +2.5 volts, and 157 is at +5 volts. Plots of transmission phase are designated generally as 180, and indicate the large range of phase shifts which may be achieved by control of gate voltage alone, with a constant gate-to-ground impedance.

Figure 3B:
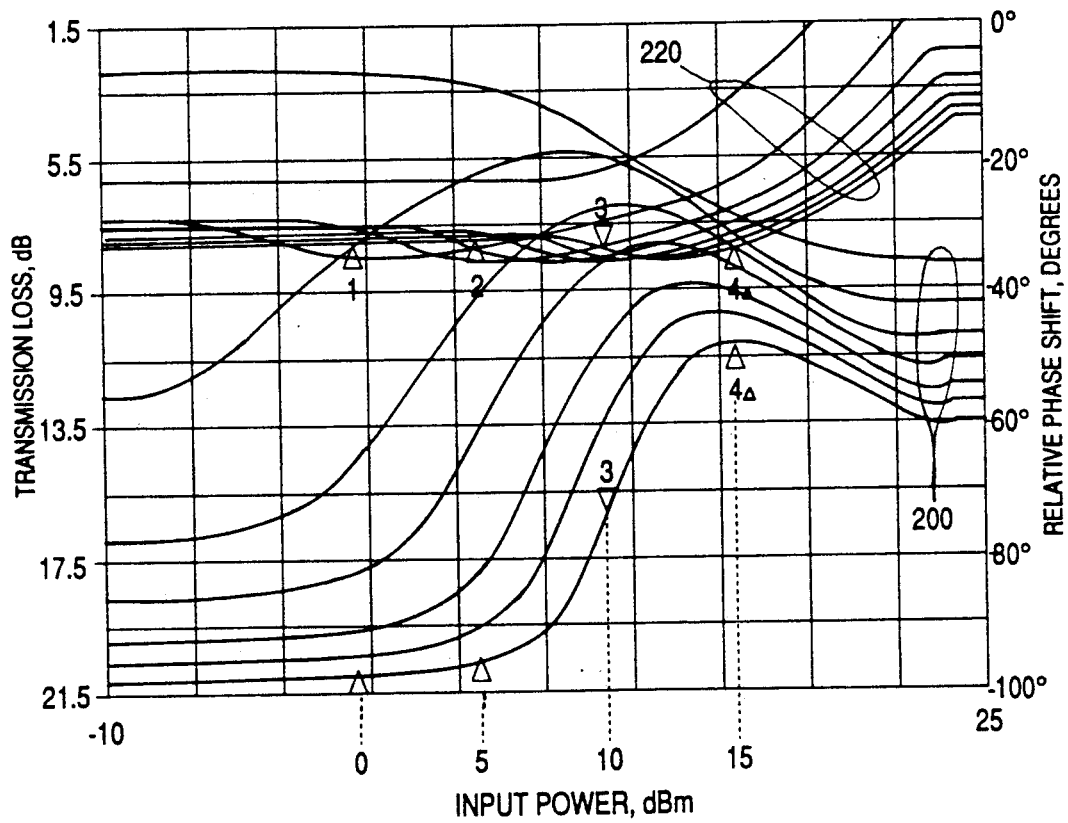

FIG. 3b illustrates plots similar to those of FIG. 3a, but with electrode 82 of FET 80 of FIG. 2 connected as the source and electrode 84 as the drain. In FIG. 3b, plots 200 are loss plots, and 220 are phase plots. From these plots, it is apparent that the same general sort of nonlinearity occurs when signal traverses source-to-drain conductive path 88, regardless of the direction of signal flow therethrough. While one direction of flow or the other may be superior in a given application, neither is generally preferred.

Figure 3C:
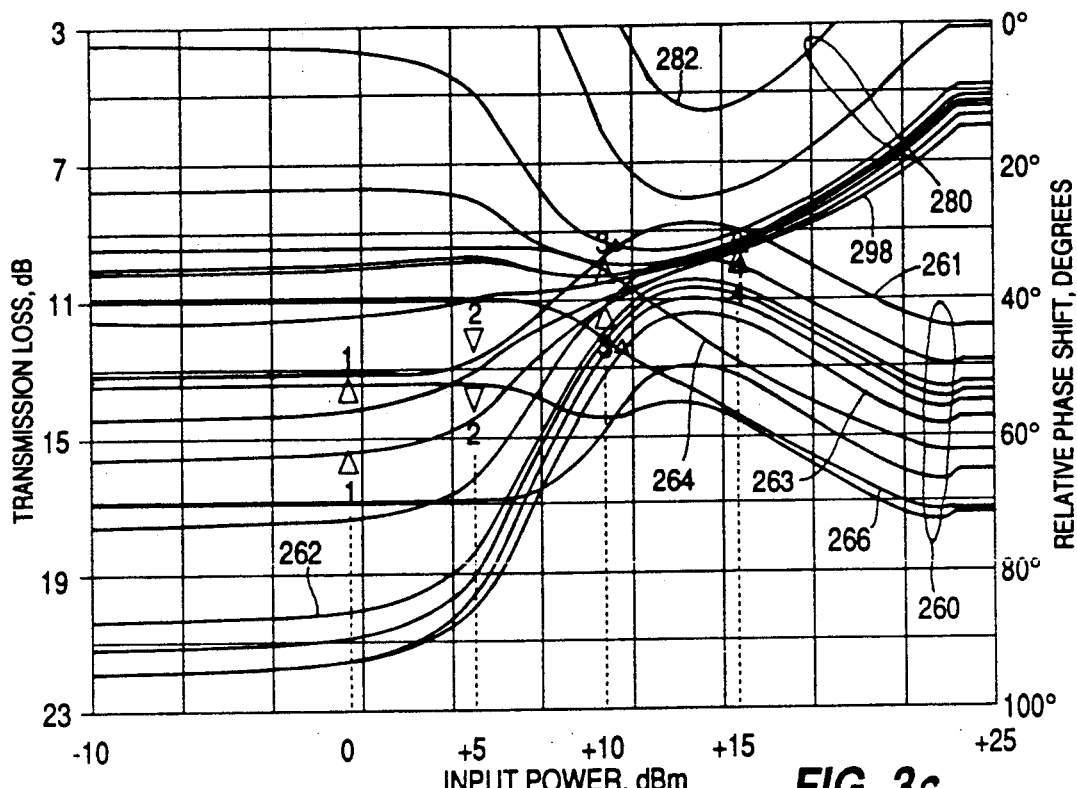
FIG. 3c is a similar plot with gate reactance as a parameter.

FIG. 3c is similar to FIGS. 3a and 3b, and illustrates the effects at 3 GHz of various magnitudes of reactance of capacitor 106 of FIG. 2 for a structure similar to that of FIG. 2 in which electrode 82 is the source and electrode 84 is the drain, at 10 V bias voltage. In FIG. 3c, plots 260 are of transmission loss and 280 are of phase shift. Among the loss plots, 261 is for a gate reactance to ground of +J40 ohms, plot 262 is for +J26 ohms, plot 263 is for +J19 ohms, plot 264 represents −J20 ohms, and 266 represents −J10 ohms. Among transmission phase-shift plots 280, plot 282 is for a gate-to-ground reactance of −J20, and plot 298 is for +J40, and the positions of the plots therebetween are monotonically related to the reactance for values between −J20 and +J40.

Figure 4:
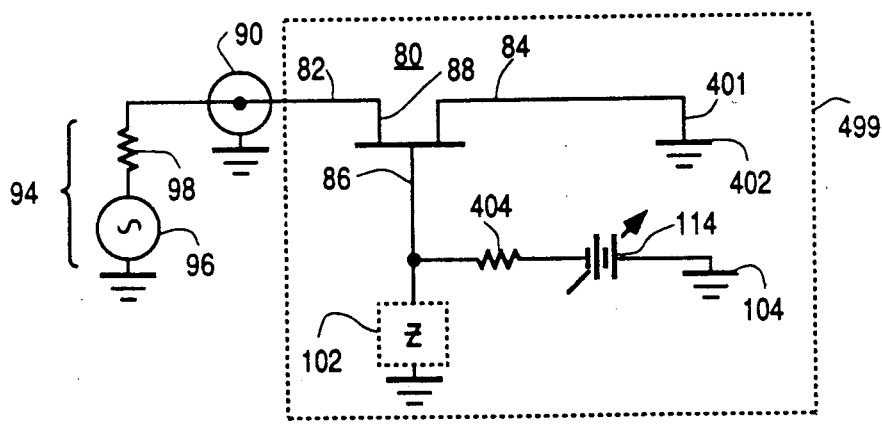
FIG. 4 is a schematic diagram of a FET coupled in a reflective arrangement.

FIG. 4 illustrates a FET coupled in a reflective arrangement 499 in accordance with the invention. FIG. 4 is similar in some ways to FIG. 2, and corresponding elements are designated by the same reference numeral. In FIG. 4, reflective arrangement 499 includes an electrode 84 of FET 80 which is connected by way of a coupling path illustrated as 401 to a source of reference potential illustrated as ground 402. Gate electrode 86 of FET 88 is connected to a bias source illustrated as a battery 114 by way of an impedance illustrated as a resistor 404. Those skilled in the art will understand that in principle, battery 114 has zero internal impedance, and therefore both the AC and DC impedance to ground from gate electrode 86 is established by the resistance of resistor 404. Those skilled in the art will also recognize that substantially all the direct voltage produced by battery 114 is developed between electrode 86 and electrodes 82 and 84, because no separate direct bias is established for electrodes 82 and 84, and because resistor 98 has a relatively low value such as 50 ohms.

It has been found that in at least some cases, it is not necessary to have a direct-current return to both electrodes 82 and 84, and it may even be desirable to have only one return, with a DC block for one of the electrodes.

In FIG. 4, the signal applied from signal generator 94 by way of port 90 traverses the source-to-drain conducting path 88 of FET 80 twice, the first time from electrode 82 to the short-circuit at ground 402, and from ground 402 back to electrode 82 by way of electrode 84. This may also be viewed as a reflection from a nonlinear impedance connected at port 90.

Figure 5A:
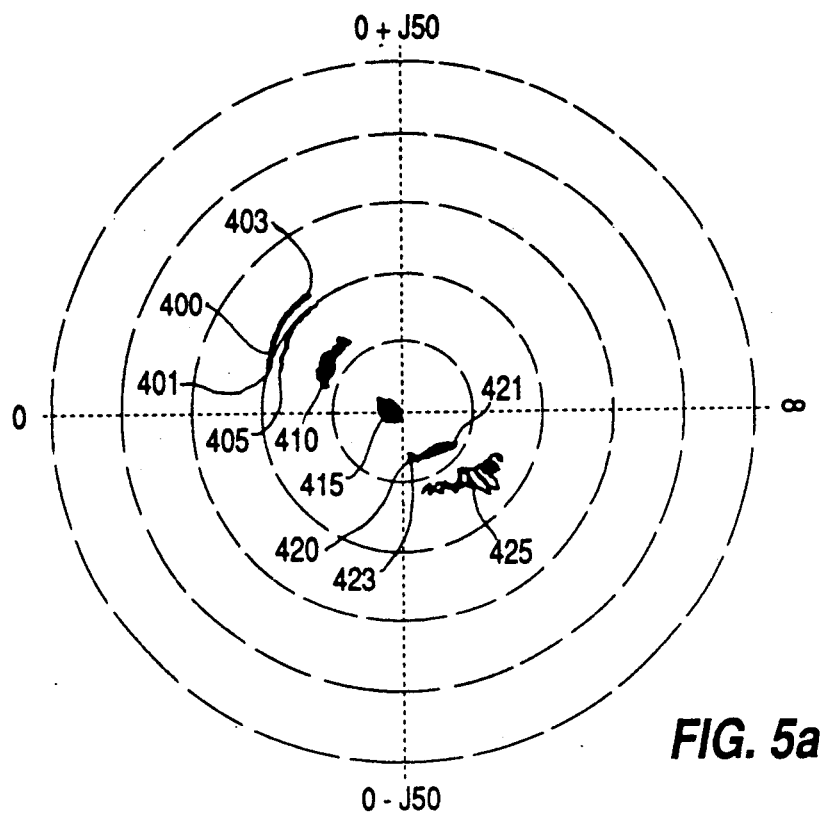
FIG. 5a illustrates impedance plots over a range of frequencies for the arrangement of FIG. 4, with signal power level as a parameter.

FIG. 5a illustrates a plurality of simplified "Smith" plots of impedance presented by the arrangement of FIG. 4 to port 90 over a frequency range of 1 to 3 GHz at a gate bias voltage of −0.5 volt for various input signal power levels. For the plot of FIG. 5a, electrode 82 of FET 80 of FIG. 4 was the drain electrode and resistor 404 had a value of 470 ohms. The gate impedance to ground contributed by impedance 102 was infinite, so only resistor 404 contributed to the gate-to-ground impedance. In FIG. 5a, plot 400 represents the impedance at an input power level of −10 dBm, with 1 GHz at end 401 of plot 400, and 3 GHz at end 403 (all the plots of FIGS. 3a and 3b have frequency increasing in a clockwise direction around center). Plot 405 is for +5 dBm input power, plot 410 for +10 dBm, 415 for +15 dBm, and plots 420 and 425 for +20 and +25 dBm, respectively. The 1 and 3 GHz ends of plots 420 are designated 421 and 423, respectively.

Figure 5B:
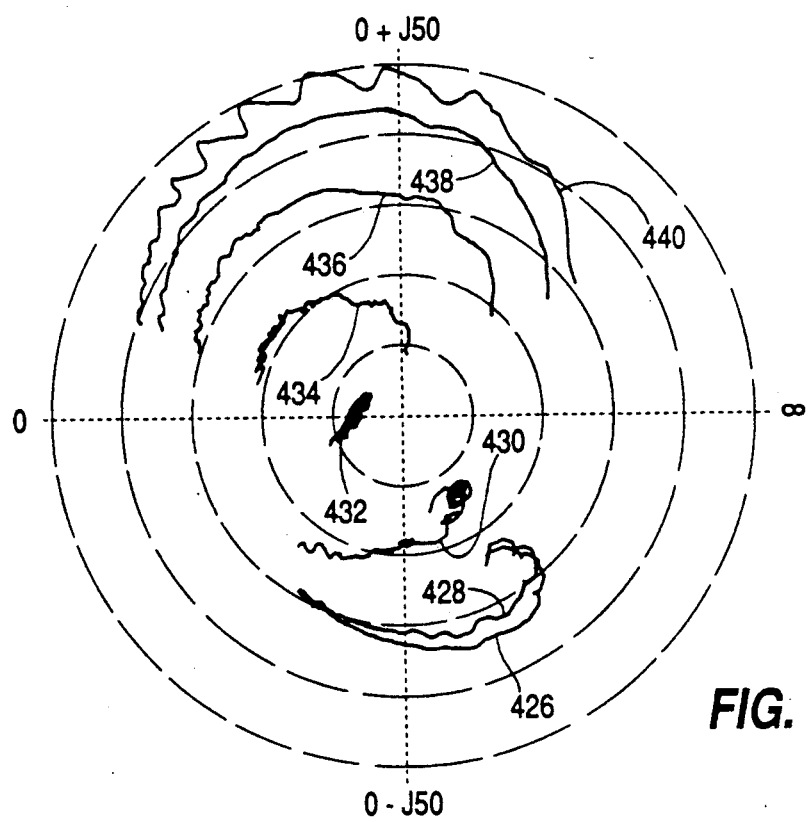
FIG. 5b is a corresponding plot for an antiparallel diode pair such as that illustrated as 22 in FIG. 1.

FIG. 5b illustrates, for comparison, a plurality of similar simplified "Smith" plots of impedance represented by an antiparallel diode pair over a like frequency range. In FIG. 5b, plot 426 is at −10 dBm, 428 is −5 dBm, 430 at 0 dBm. Plots 432, 434, 436, 438 and 440 are for +5, +10, +15, +20, and +25 dBm, respectively. Comparison of the plots of FIGS. 3a and 3b reveals that the plots for the FET (FIG. 3a) have a much smaller change in reactance over a spread of frequencies than the diode pair, and also a much more consistent resistance component (radius) of the impedance as a function of frequency. These features of the FET allow more precise control of the nonlinearity as a function of frequency, added to the greater number of controllable parameters or "handles" by which appropriate distortion may be selected.

Figure 6A:
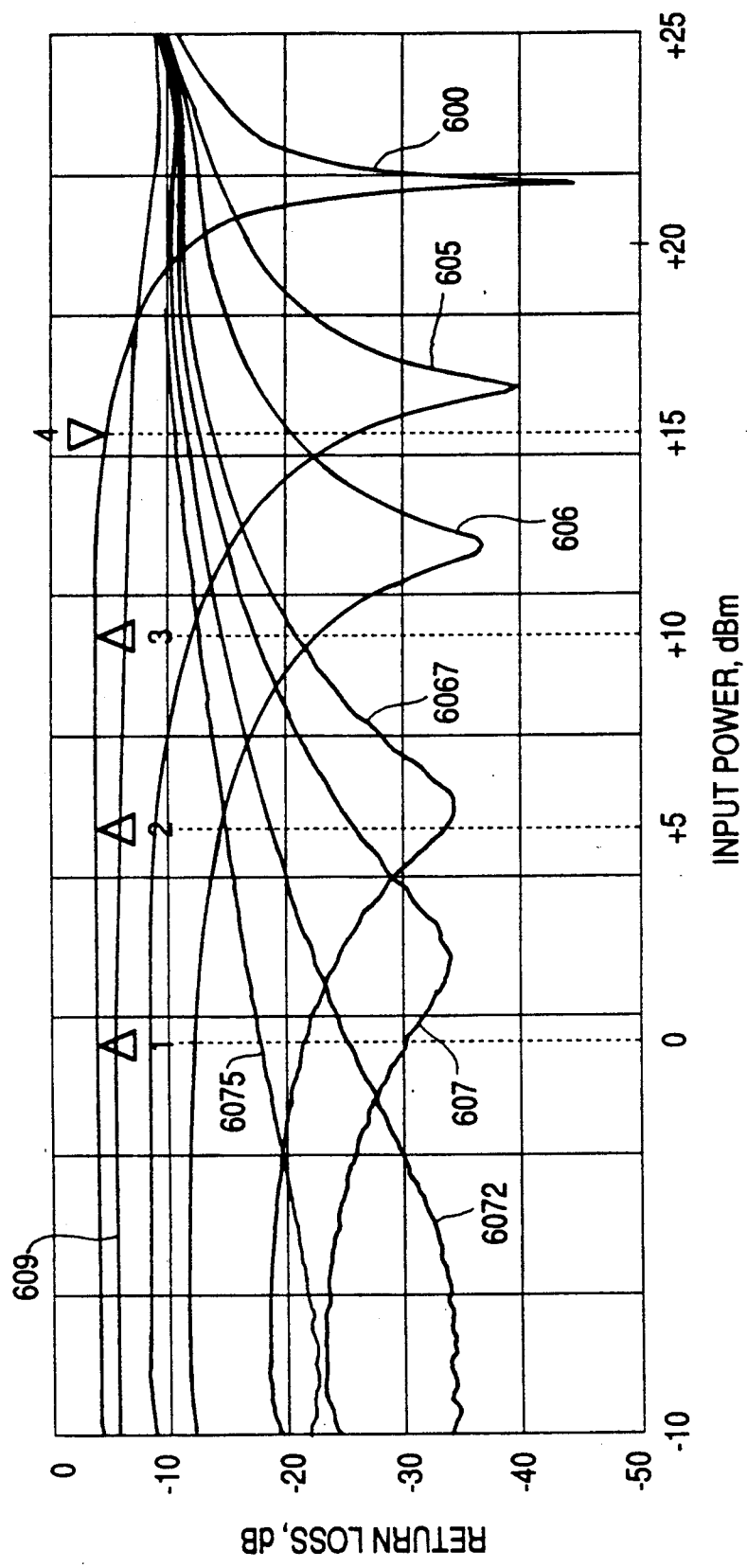
FIGS. 6a and 6b illustrate plots of the input return loss magnitude and phase, respectively, versus signal level, for the arrangement of FIG. 4, with gate voltage direct bias as a parameter
Figure 6B:
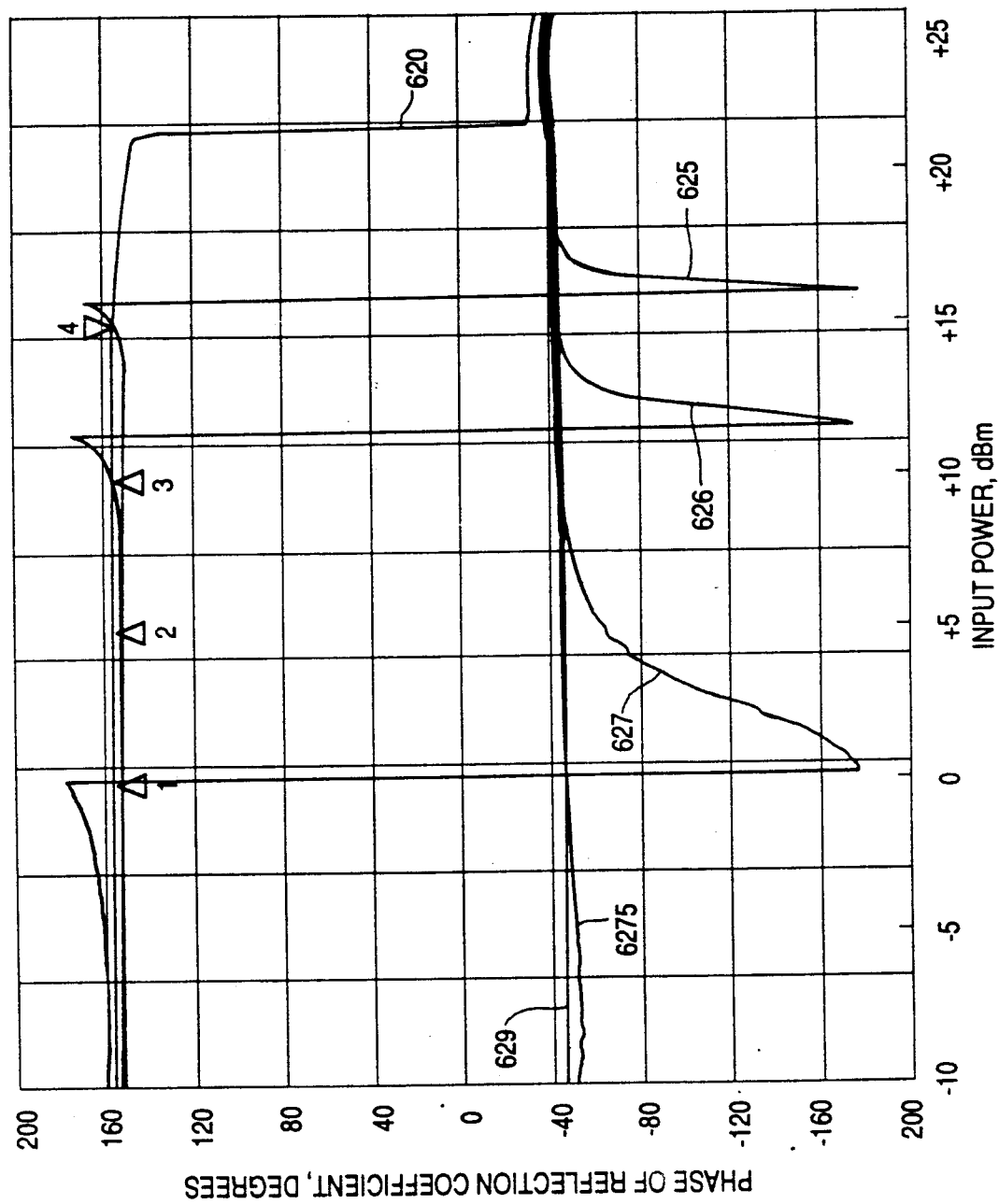

FIG. 6a illustrates magnitude of the input return loss as a function of power level for the arrangement of FIG. 4 in the example described above, at a frequency of 1.5 GHz, with an infinite value of gate impedance 102, and with bias voltage as a parameter. In FIG. 6a, plot 600 represents the magnitude at zero volts of gate bias, plot 605 is at −0.5 volts, 606 at −0.6 volts, 6067 at −0.675 volts, and 607 at −0.7 volts. Plots 6072, 6075 and 609 are at −0.725, −0.75 and −0.9 volts of gate bias, respectively. FIG. 6b illustrates the phase of the reflection in the arrangement of FIG. 4a as a function of power level with bias voltage as a parameter, for the same example as that of FIG. 6a. In FIG. 6b, plot 620 represents the phase of the input reflection coefficient at zero volts of gate bias. Plots 626, 627, 6275 and 629 represent the phase of the input reflection coefficient at −0.5, −0.6, −0.7, −0.75 and −0.9 volts of gate bias, respectively. The plots of FIGS. 6a and 6b indicate that the phase and amplitude of the reflection coefficient are under control of the gate voltage and input signal power level, in a reflective operating mode, much as the through loss and phase shift are under corresponding control in a transmissive mode.

FIG. 6c plots the magnitude of the reflection coefficient, in the form of return loss versus input power of the arrangement of FIG. 4, at a bias voltage of zero volts, and with gate reactance as a parameter. In FIG. 6c, curve 669 is for a gate reactance of +J19 ohms, plot 670 is at +J20 ohms, and plot 676 is for +J26 ohms. Similarly, plots 630, 634, 637 and 640 are at +J30, +J34, +J37 and +J40 ohms, respectively.

FIG. 6d plots the phase of the reflection coefficient, in degrees, of the arrangement of FIG. 4 at a bias voltage of zero volts, and with gate reactance as a parameter. Curves 680, 682, 684, 686, 688, 690 and 692 correspond to gate reactance of +J19, +J20, +J26, +J30, +J34, +J37 and +J40, respectively.

Figure 7:
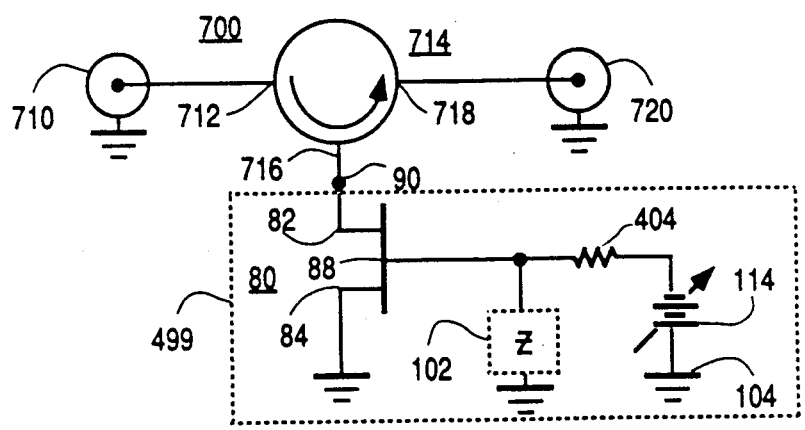
FIG. 7 is a simplified diagram in schematic form illustrating a reflective predistortion equalizer according to the invention using a circulator with a port coupled to the source or drain of a FET.

FIG. 7 illustrates a predistortion equalizer 700. In FIG. 7, an input port 710, which is adapted to receive a signal to be predistorted, is connected to a port 712 of a three-port circulator 714. Signals applied to port 712 of circular 714 circulate to, and exit from, an input-output port 716, and are applied therefrom to an input port illustrated as 90 of a reflective arrangement 499 corresponding to that of FIG. 4, in which the elements are designated by the same reference numerals as in FIG. 4. The signals reflected by impedance circuit 499 are reapplied to input-output port 716 of circulator 714, and circulate to a further port 718, from which they are coupled to output port 72 of predistortion equalizer 700 of FIG. 7. Thus, signals to be predistorted may be applied to input port 710 of the predistortion equalizer of FIG. 7 and appear at output port 720 modified with a nonlinearity in accordance with that described in FIGS. 5a, 6a, and 6b.

FIG. 8 plots through loss versus input magnitude at a frequency of 1.6 GHz for predistortion equalizer 700 of FIG. 7 with a gate impedance of approximately +J15 ohms contributed by a gate capacitor similar to capacitor 106 of FIG. 2 within impedance element 102, and with gate bias voltage as a parameter. In FIG. 8, plots 806, 807, 808, and 809 are four gate bias voltages −0.6, −0.7, −0.8, and −0.9 volts, respectively, and plots 810, 811, and 815 are for +1.0, +1.1 and +1.5 volts, respectively.

Figure 9:
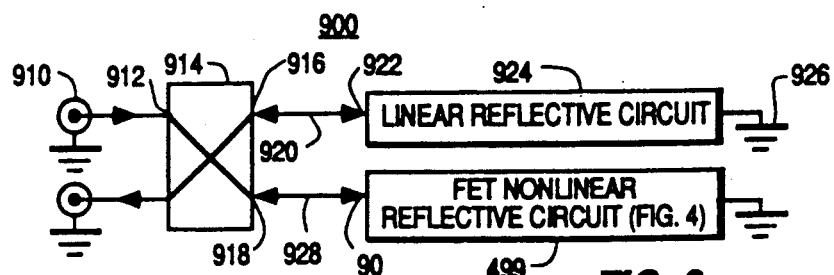
FIG. 9 is a block diagram of a reflective predistortion equalizer according to the invention using a hybrid coupler and illustrating the nonlinear device as a block.

FIG. 9 is a simplified block diagram of a reflective predistortion equalizer 900 according to the invention, which uses a hybrid coupler or directional coupler, and a reflective distortion generator such as that of FIG. 4. In FIG. 9, signals applied to an input port 910 are coupled to an input port 912 of a 3 dB quadrature hybrid splitter or combiner 914. Signals applied to input port 912 of 3 dB hybrid 914 are coupled with −3 dB amplitude and reference phase to a first output port 916 and with −3 dB amplitude and a 90° phase shift to a second output port 918. The signals appearing at output port 916 of hybrid 914 are applied by way of a conductor 920 to an input port 922 of a linear reflective circuit illustrated as 924, which includes at least one connection to a reference potential, illustrated as ground 926. The signals produced at output port 918 are applied over a conductive path 928 to an input port 930 of FET nonlinear reflective circuit 499, illustrated as a block. Details of circuit 499 are discussed supra in connection with FIG. 4.

Figure 10:
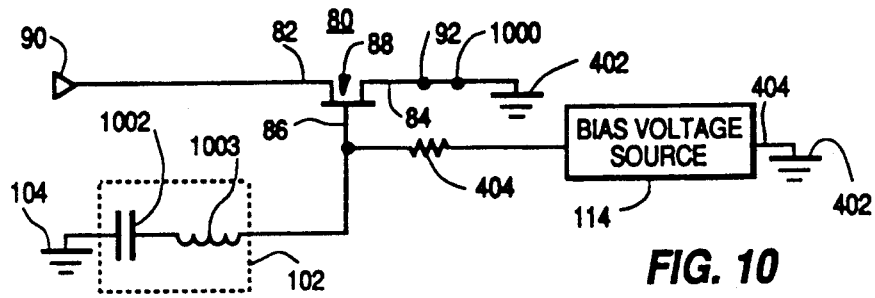
FIG. 10 is a diagram in block and schematic form of a prototype reflective FET distortion generator in accordance with the invention, usable in the arrangement of FIG. 9.

FIG. 10 illustrates the reflective FET distortion generator 499 of FIG. 4 for reference, with bias voltage source 114 illustrated as a block, and with electrode 84 coupled to ground by a connector pair 92, 1000. As illustrated in FIG. 10, impedance 102 includes the reactances of a capacitor 1002 in series with an inductor 1003 coupled between gate electrode 86 and ground 104. This arrangement has the advantage that an alternating-current reactance device such as an inductor may be coupled between gate electrode 86 and ground 104, without disrupting the application of bias voltage to gate electrode 86 of FET 80. With this arrangement, resistance 404 provides only isolation, and may be replaced by an inductor or radio-frequency choke (RFC) as is well known in the art. A resistor may be advantageous, however, for certain polarities or values of gate bias, for preventing burn-out of the FET by limiting gate current.

Figure 11:
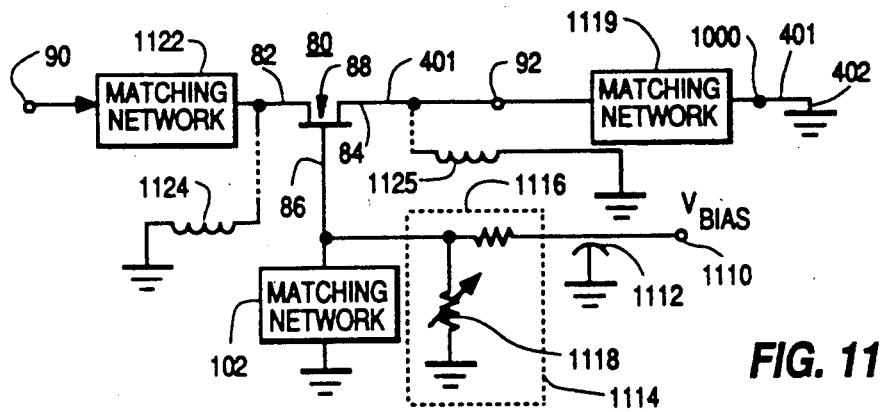
FIG. 11 illustrates in simplified block and schematic diagram form further details which may be used in conjunction with the prototype of FIG. 10 for application in the arrangement of FIG. 9.

FIG. 11 illustrates another reflective circuit using the source-to-drain conductive path of a FET, which may be useful in the arrangements of FIGS. 7 or 9. Elements of FIG. 11 corresponding to those of FIGS. 4 or 10 are designated by the same reference numerals. In FIG. 11, a fixed bias voltage $V_{BIAS}$ is coupled from an external source to an input terminal 1110, and, in conjunction with a radio frequency bypass capacitor 1112, corresponds to bias voltage source 114 of FIG. 10. The bias voltage is applied to a voltage divider 1114 including a series resistor 1116 coacting with a shunt resistor 1118 to produce a voltage on gate electrode 86. This arrangement may provide the advantage of a low resistive component of impedance to ground, but resistor 1118 may not otherwise be necessary. The AC impedance to ground from gate electrode 86 is established by a gate impedance matching network illustrated as a block 102. Source or drain electrode 84 is connected to ground by way of a matching network 1119 and a matching network 1122 is interposed between input port 90 and drain or source electrode 82 of FET 80. As is known to those skilled in the art, if one or both of matching networks 1119 or 1122 blocks direct current e.g. if it includes a series capacitor, one or both bias tees illustrated as a radio-frequency chokes 1124 and 1125 may be connected from electrode 82 and 84 to ground, if desirable. In some cases, having one or the other of electrodes 82 or 84 blocked from ground for the flow of direct current may enhance operation.

One or more of matching networks 102, 1119, and 1122 may be deleted from the arrangement, according to the desired operation. Each matching network may include a circuit of one or any number of lumped or distributed elements, providing any one or all of inductance, capacitance, and resistance, and the elements may be arranged in circuits of any complexity, as may be required by the application.

Figure 12:
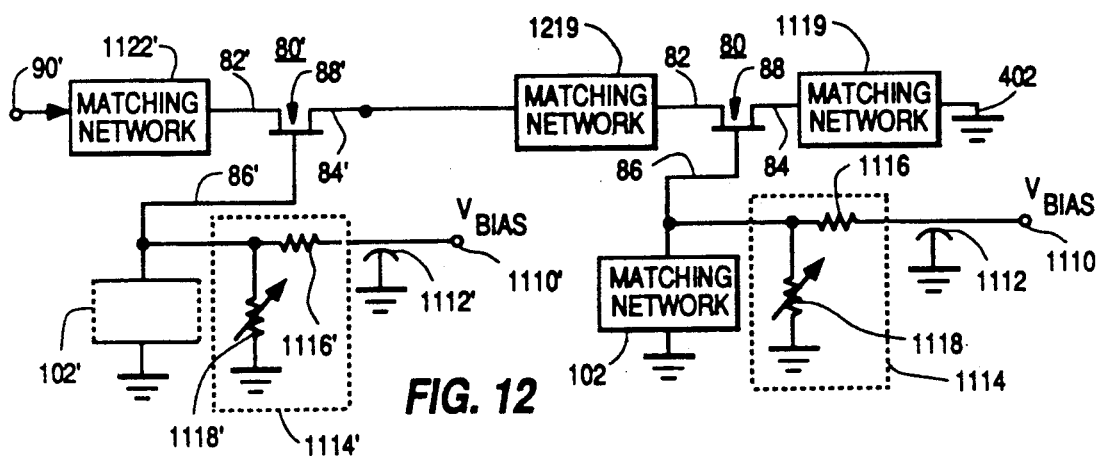
FIG. 12 illustrates the cascade of plural FETs in accordance with an embodiment of the invention.

As so far described, the nonlinearity has been provided by the source-to-drain conductive path 88 of a single FET. The arrangement of FIG. 12 illustrates how the source-to-drain conductive paths of plural FETs can be cascaded in a reflective arrangement, and biased at different voltage levels in order to provide more control over the nonlinearity. Elements of FIG. 12 corresponding to those of FIG. 11 are designated by the same reference numerals. In FIG. 12, a further FET 80' has one of its source or drain electrode 84' connected, by way of port 90 and a matching network 1219, to electrode 82 of FET 88. Further FET 80' has its drain or source electrode 82' connected by way of a matching network 1122' to an input port 90'. Matching network 1219 subsumes the impedances of the cascade of two matching networks 1119 and 1122. Bias voltage source $V_{BIAS}$ is applied to a further terminal 1110' and, by way of a RF bypass capacitor 1112' and a further voltage divider 1114', to gate electrode 86'. Adjustable resistor 1118' allows control of the voltage applied to gate electrode 86' independent of the voltage applied to gate electrode 86. As described above, the various matching networks may have simple or complex circuit configurations of one or all of resistors, capacitors, or inductors, or their corresponding distributed equivalents. Additional sections of distortion generator including further matching networks, FETs and bias voltage adjustment networks may be cascaded at port 90' of the arrangement of FIG. 12. Since more control over the nonlinearity is achieved by the use of plural cascaded FETs in this manner, it may be that less circuit complexity is required in the matching networks to achieve the desired performance, whence it may be found that some or all of the matching networks in the cascade may be dispensed with.

Similarly, two or more FETs may be paralleled by joining their source electrodes and their drain electrodes, or possibly source electrodes may be joined to drain electrodes, and they may be operated at different levels of nonlinearity by application of different gate bias voltages, different gate impedances, or both. In some instances, matching networks between the various source electrodes or drain electrodes may provide improved control.

Figure 13:
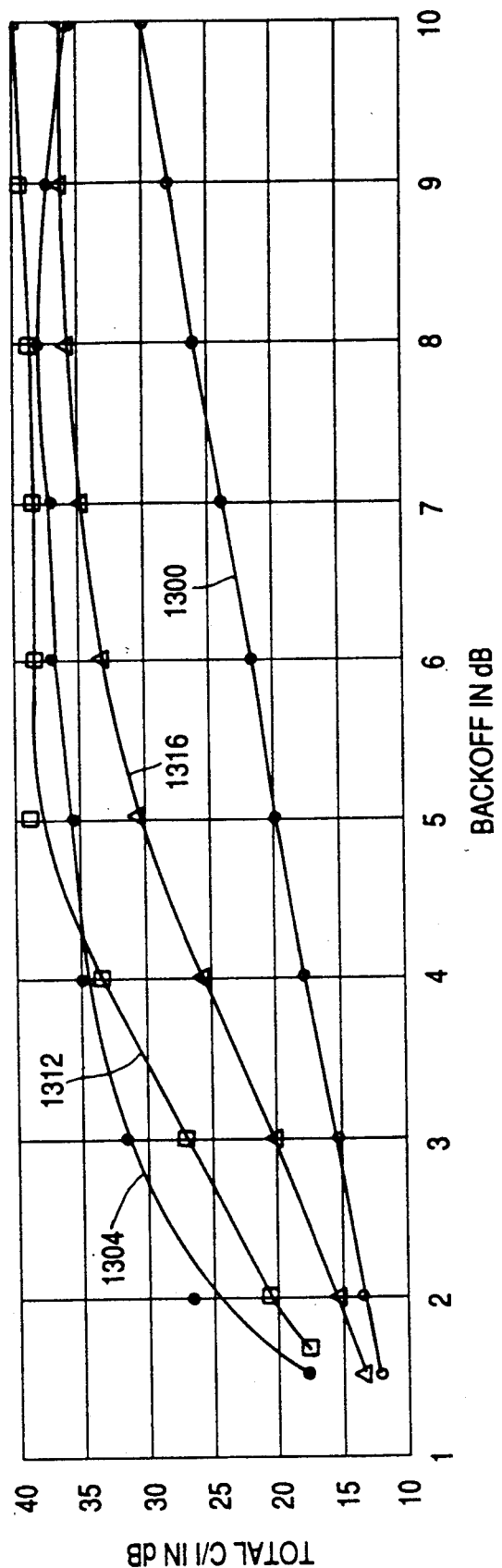
FIGS. 13 and 14 include plots of the performance of Hughes TWT amplifiers (suited to the frequency) both alone and with reflective predistortion equalizers according to the invention, at 1.6, 4.0 and 12 GHz in the case of FIG. 13, and at 3.8, 4.0 and 4.2 GHz in the case of FIG. 14.

FIG. 13 illustrates the improvement achieved by the use of a reflective linearizer in accordance with the invention at L, C and $K_U$ bands. In FIG. 13, plot 1300 represents the carrier-to-intermodulation ratio (C/I), in dB, of a typical TWT amplifier alone, plot 1316 represents the performance at a frequency of 1.6 GHz, 1304 represents the performance at 4.0 GHz, and 1312 represents the performance at 12 GHz, all with reflective linearizers using quadrature hybrids as illustrated in FIG. 9.

Figure 14:
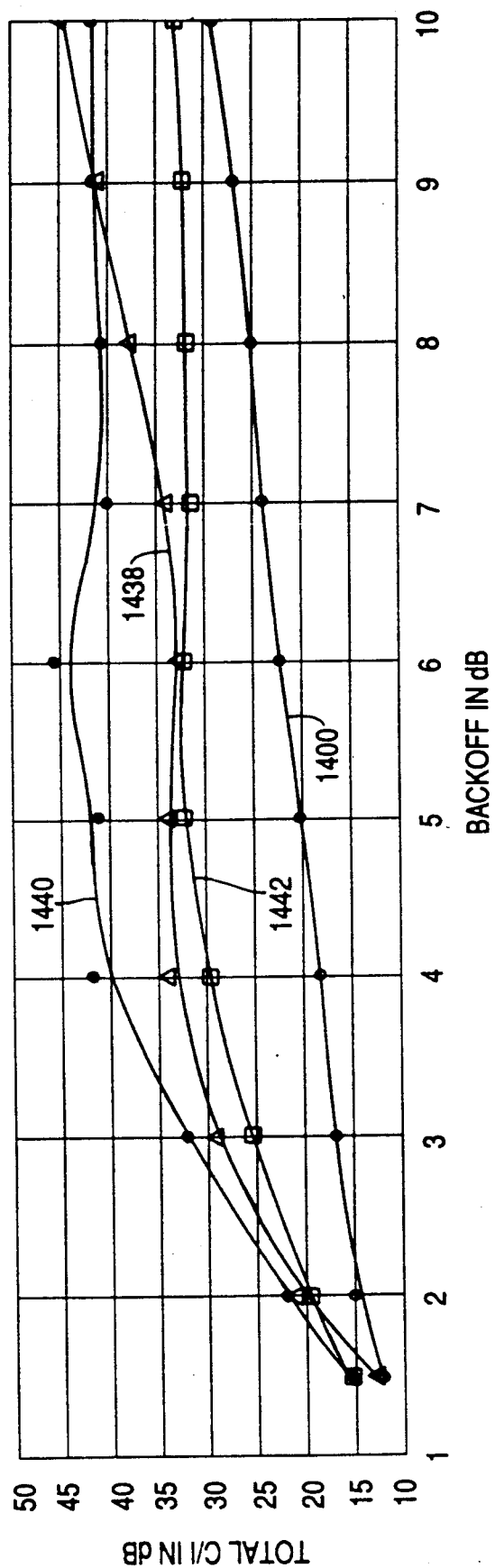

FIG. 14 illustrates the C/I ratio in dB for a particular traveling-wave tube amplifier (TWT) and the predistortion equalizer illustrated in FIG. 9. In FIG. 14, 1400 illustrates the C/I ratio of the TWT alone as a function of backoff from a particular power output level, with two input signals closely spaced in frequency. Plot 1440 illustrates the improvement in C/I as a result of cascading with the predistortion equalizer at a frequency of 4.20 GHz, and plots 1438 and 1442 are corresponding plots at 3.8 and 4.2 GHz, respectively.

Figure 15:
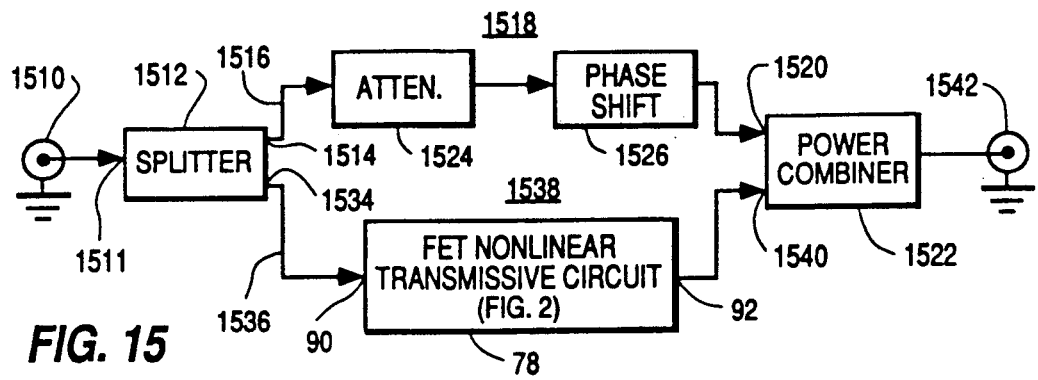
FIG. 15 is a diagram in block and schematic form of a transmission predistortion equalizer using a power splitter, a power combiner, and a transmissive FET distortion generator such as that of FIG. 2, in accordance with the invention.

FIG. 15 is a simplified block diagram of a transmission-type predistortion equalizer in accordance with the invention. In FIG. 15, an input port 1510 is coupled to a signal power divider or splitter 1512, which divides the signal into two portions, which may be of equal amplitude. A first portion of the signal is applied from an output port 1514 of splitter 1512 by way of a conductive path 1516 to an upper or linear channel designated generally as 1518, which couples signals to an input port 1520 of an output power combiner 1522. Upper channel 1518 may includes a separate attenuator 1524 and phase shifter 1526, and may include other elements. A second portion of the signal produced by splitter 1512 is applied from an output port 1534 of splitter 1512 over a conductor 1536 to a lower or nonlinear transmission channel 1538 which translates the signals to an input port 1540 of power combiner 1522. In combiner 1522, the linearly translated signals applied to input port 1520 are combined with the nonlinearly translated signals applied to input port 1540 to produce a combined predistorted signal at output port 1542. The signals from output port 1542 may be applied to a power amplifier (not illustrated) which produces distortion at its normal operating levels. Lower or nonlinear transmission path 1538 includes a FET nonlinear transmissive circuit in accordance with the invention, and in particular may use the arrangement of FIG. 2.

Figure 16:
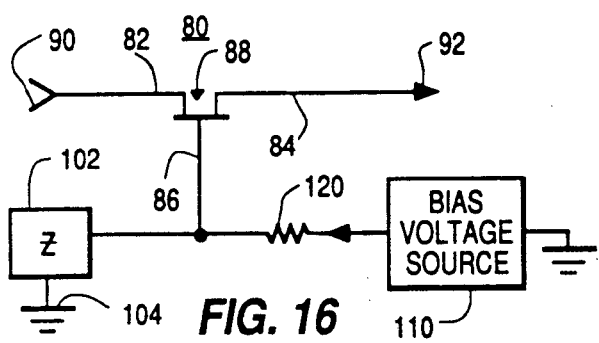
FIG. 16 is a diagram in schematic and block form of the transmissive predistortion equalizer of FIG. 2 for reference.

FIG. 16 illustrates a FET nonlinear transmissive circuit similar to FIG. 2, with bias source 110 illustrated as a block. As in the case of FIG. 2, impedance or matching network block 102 may include an infinite impedance to ground, or it may include a circuit of any complexity, as may be required in order to match the distortion of the main amplifier for which predistortion is being provided. The arrangement of FIG. 16 may be used either alone as a transmissive predistortion equalizer, or as element 78 of the arrangement of FIG. 15.

Figure 17B:
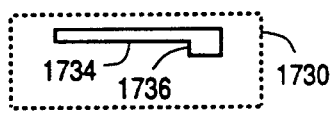
Figure 17E:
Figure 17A:
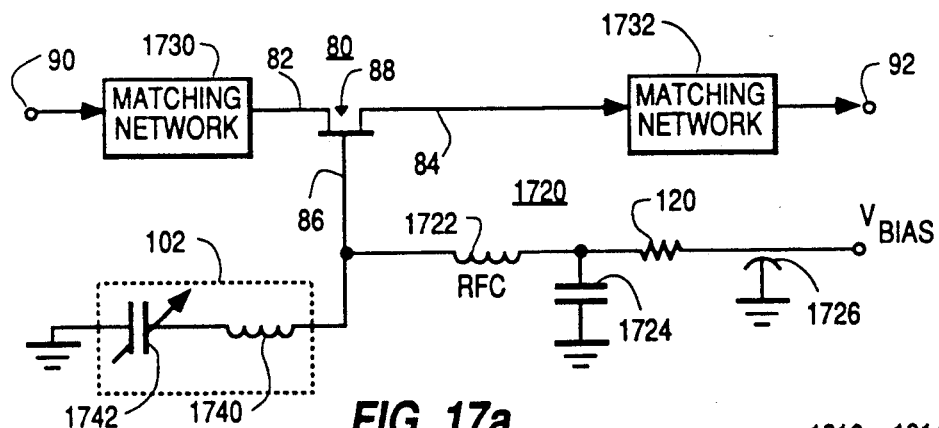
FIG. 17a is a diagram in block and schematic form of a predistortion equalizer using a transmission FET distortion generator which may be used alone or with an arrangement such as that of FIG. 15, and which includes ancillary circuits.
Figure 17C:
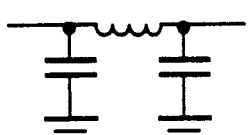
Figure 17D:
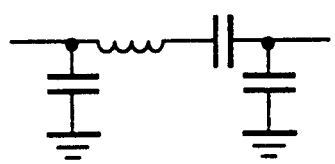

FIG. 17a illustrates a further FET nonlinear transmissive circuit which may be used alone or with the arrangement of FIG. 15. In FIG. 17a, elements corresponding to those of FIG. 2 are designated by the same reference numerals. In FIG. 17a, a matching network illustrated as 1730 is interposed between input port 90 and source or gate electrode 82 of FET 80, and another matching network 1732 is coupled between drain or source electrode 84 and output port 92. One or both of matching networks 1730 and 1732 may be as simple as a transmission line such as the λ/4 microstrip line illustrated as 1734 in FIG. 17b, with or without a capacitive tab 1736 adjacent FET electrode 82. Transmission line 1734 may be of constant width or may vary in width along its length. Matching networks 1730 and 1732, and impedance block 102, may include circuits of lumped or distributed elements of any complexity. FIGS. 17c and 17d illustrate lumped-circuit π networks, with and without a blocking capacitor, respectively, which may be used in matching networks. The ability of such networks to provide a match to any impedance at a single frequency are well known. FIG. 17e illustrates a plan view of a microstrip conductor of alternating width which is a distributed equivalent of the arrangement of FIG. 17c.

In FIG. 17a, impedance or matching network 102 is illustrated as including two reactive elements, namely an inductor illustrated as 1740 and a variable capacitor 1742. While illustrated in lumped form, these and other elements may be in distributed form, as known in the art. The series combination of an inductor with a variable capacitor provides zero AC impedance at a resonant frequency, an inductive reactance at frequencies higher than the resonant frequency, and a capacitive reactance at frequencies lower than the resonant frequency.

Figure 18:
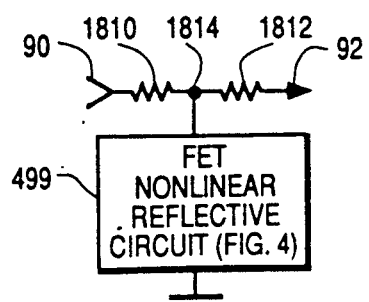
FIG. 18 is a diagram in block and schematic form of a predistortion equalizer according to the invention, illustrating the use of a reflective FET distortion generator such as one of the arrangements of FIGS. 10, 11 or 12 connected as a transmission FET distortion generator.

The arrangement of FIG. 18 illustrates another transmissive predistortion equalizer using reflective circuit 499 of FIG. 14. In FIG. 18, two cascaded impedances, in the form of a first resistor 1810 connected at a node 1814 with a second resistor 1812, extend from input port 90 to output port 92. A FET nonlinear reflective circuit illustrated as a block 499 extends from node 1814 to ground. FET nonlinear reflective circuit 499 is described in conjunction with FIG. 4, but the arrangements of FIGS. 11 or 12 may be used as well. Thus, the arrangement of FIG. 18 allows a reflective nonlinear circuit to provide nonlinearity in a transmissive circuit arrangement, just as do the circulator of FIG. 7 and the hybrid of FIG. 9.

A transmissive distortion generator using the source-to-drain paths of plural FET is not separately illustrated, but is similar to the reflective arrangement of FIG. 12, with a further port substituted for the ground of matching network 1119.

Figure 19:
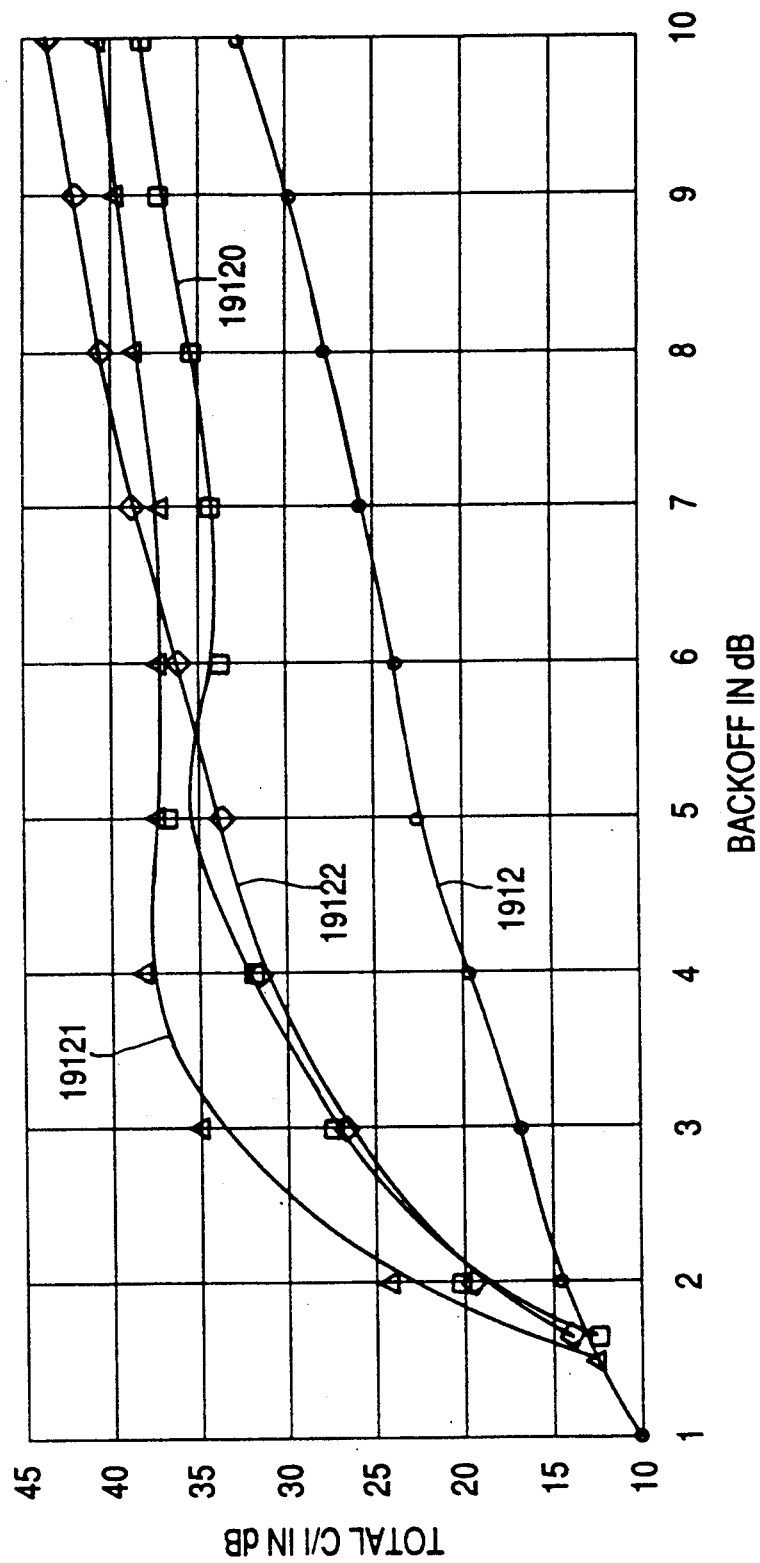
FIG. 19 includes plots of the performance of a Hughes TWT with a predistortion equalizer using a transmission distortion generator such as that of FIG. 17 at frequencies of 12.0, 12.1 and 12.2 GHz.

FIG. 19 illustrates plots of distortion for a transmissive predistortion equalizer as illustrated in FIG. 17, in which the FET nonlinear transmissive circuit is similar to that illustrated in FIG. 16. In FIG. 19, plot 1912 illustrates the nonlinearity distortion of a TWT at 12 GHz as a function of backoff level, with two input signals closely spaced in frequency. Plot 19120 represents the corresponding distortion when the TWT is cascaded with the transmissive predistortion equalizer at a frequency of 12 GHz, and plots 19121 and 19122 are corresponding plots at 12.1 and 12.2 GHz, respectively.

Figure 20:
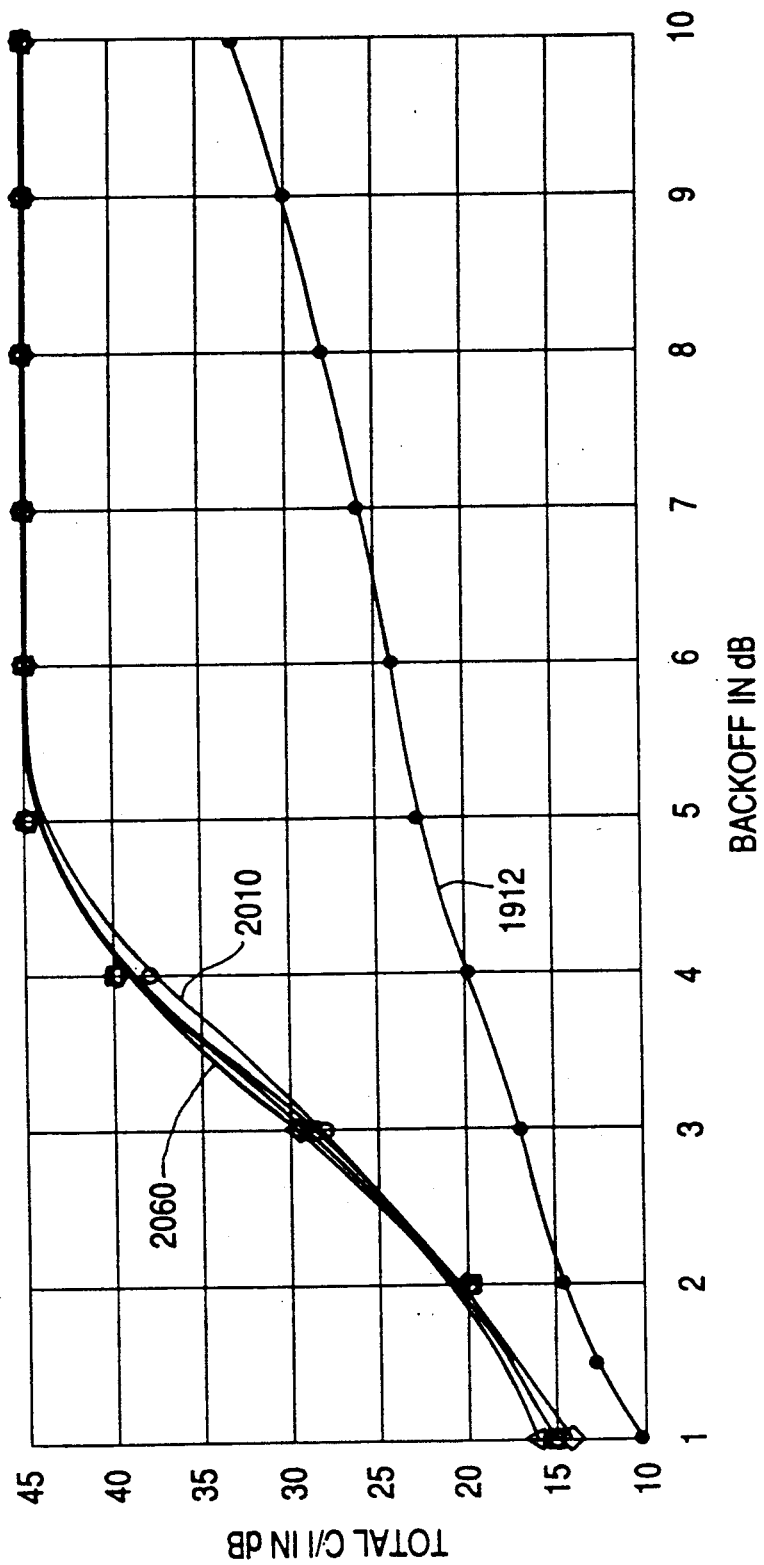
FIG. 20 includes plots of the performance of a Hughes TWT with the predistortion equalizer using a transmission distortion generator of FIG. 17, at a frequency of 12.0 GHz, at temperatures ranging from $-10°$ to $+60°$ Celsius.

FIG. 20 illustrates the temperature dependence of the predistortion equalizer mentioned in conjunction with FIG. 19 when used in conjunction with a TWT. Plot 1912 of FIG. 20 is the distortion of the TWT alone, just as in FIG. 19. Since the TWT is a thermionic tube, its temperature during operation is high, and small changes in ambient temperature do not materially affect its operation. Thus, plot 1912 represents the distortion of the TWT at all temperatures. Plot 2010 represents the distortion of a combination of the predistortion equalizer as mentioned in conjunction with FIG. 19 cascaded with the TWT, at a temperature of −10° C. The combined plots designated 2060 represent the result for all other temperatures up to and including +60° C.

Figure 21:
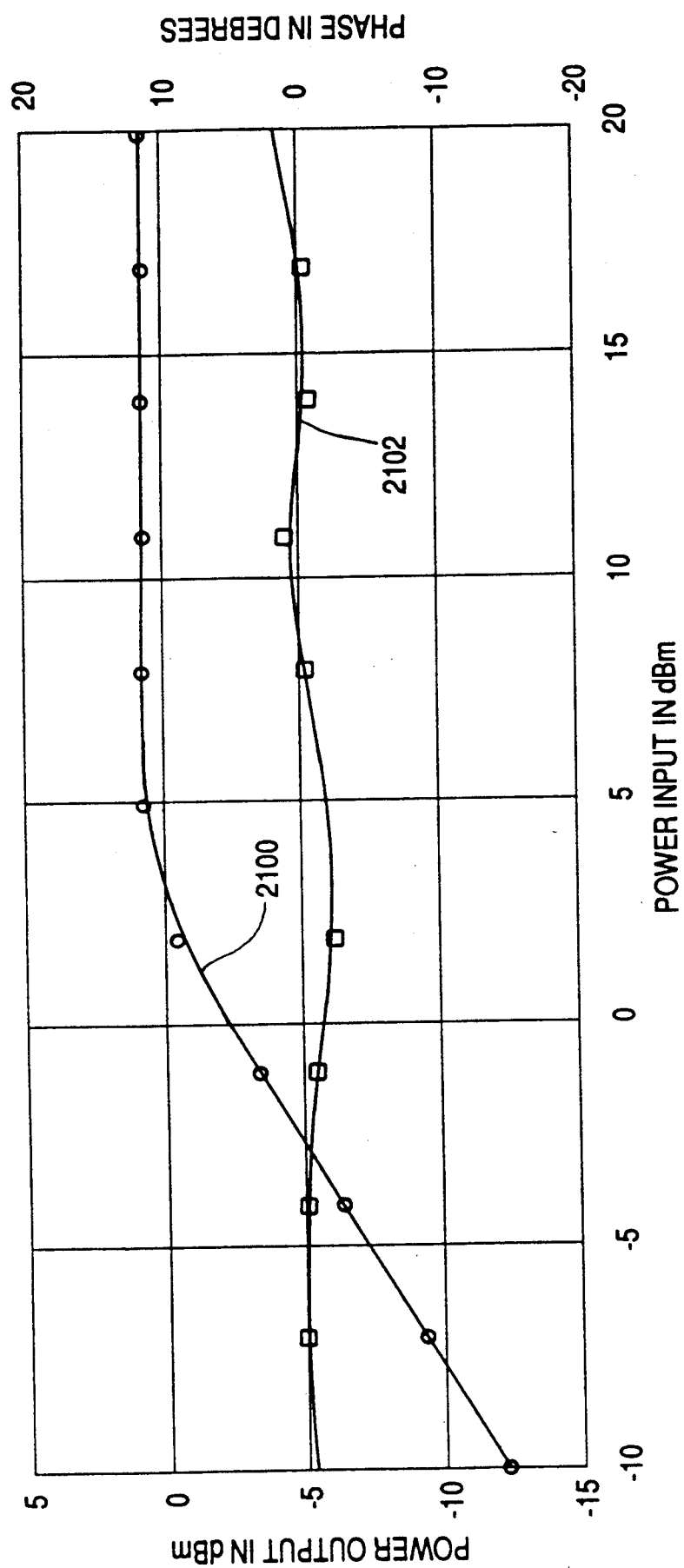
FIG. 21 plots the limiting characteristics of a reflective FET distortion generator having the structure of FIG. 7.

It has been discovered that the arrangements of FIGS. 2, 4, 10, 11, 12, 16, 17 and 18 generate distortion which may be useful in limiters or in logarithmic converters (commonly known as log amps). A limiter may be connected in a reflective arrangement such as those of FIGS. 4, 10, 11 or 12. FIG. 21 plots the 2.75 GHz characteristics of the circulator arrangement of FIG. 7 as a reflective limiter, with the gate voltage at about +0.19 volts and gate capacitance about 2 picofarads (PF) for best flatness of amplitude curve 2100. Since the capacitor self-resonates below 2.75 GHz, this condition of the capacitor corresponds to maximum inductive reactance. The phase remains within a few degrees of zero, as indicated by plot 2102.

Figure 22:
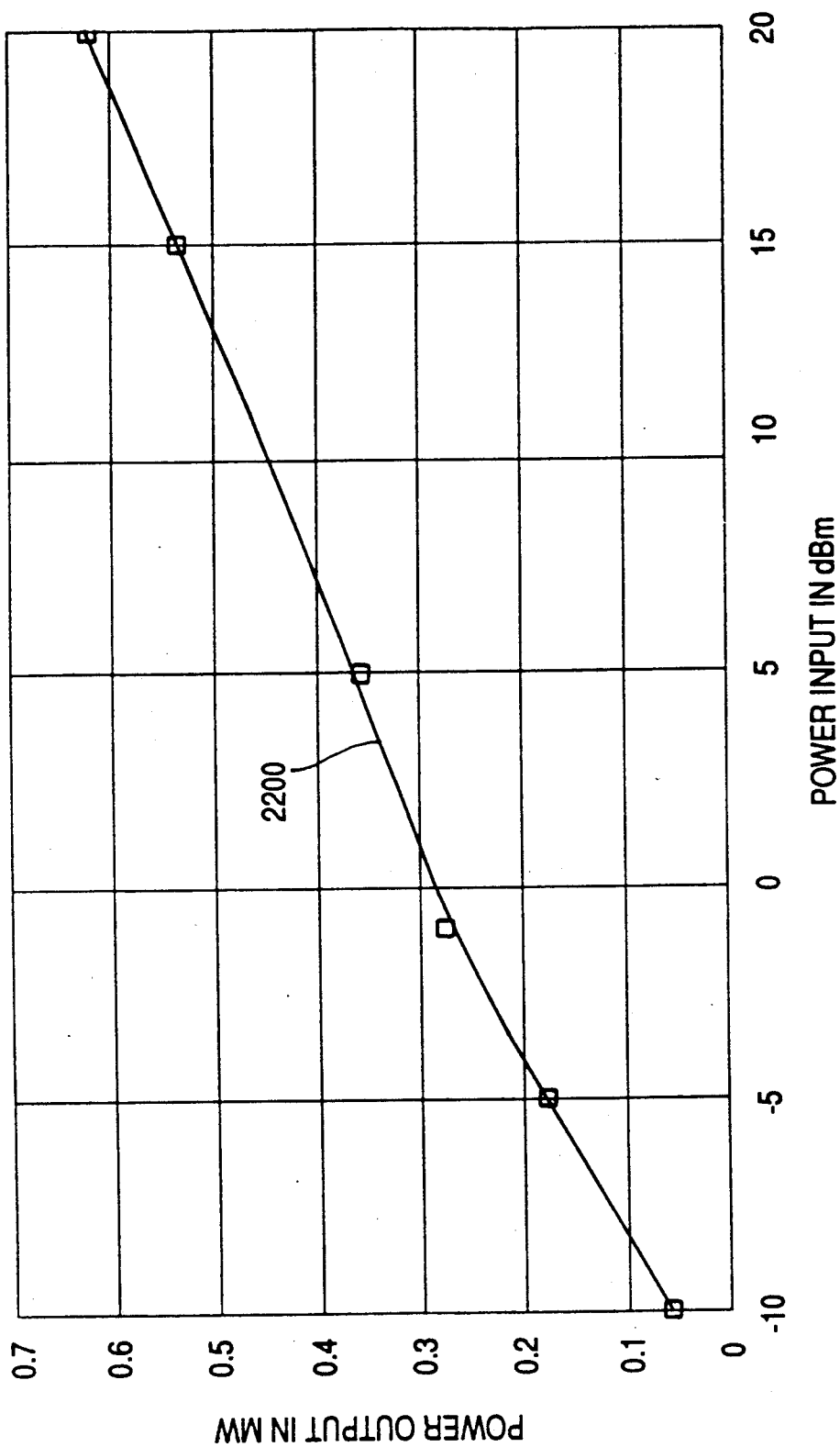
FIG. 22 plots the logarithmic characteristics of the same reflective structure.

FIG. 22 plots output power against the logarithm of input power (the input power in dBm), to form a log-lin plot of the transfer function of the arrangement of FIG. 7 under the same conditions as those for FIG. 21. In FIG. 22, plot 2200 includes two substantially straight-line segments, one above about 0 dBm input power, and the other below, which have slightly different slopes. The slopes are controllable with gate voltage and/or gate impedance. A straight-line characteristic of a log-lin plot indicates a logarithmic response.

Figure 23:
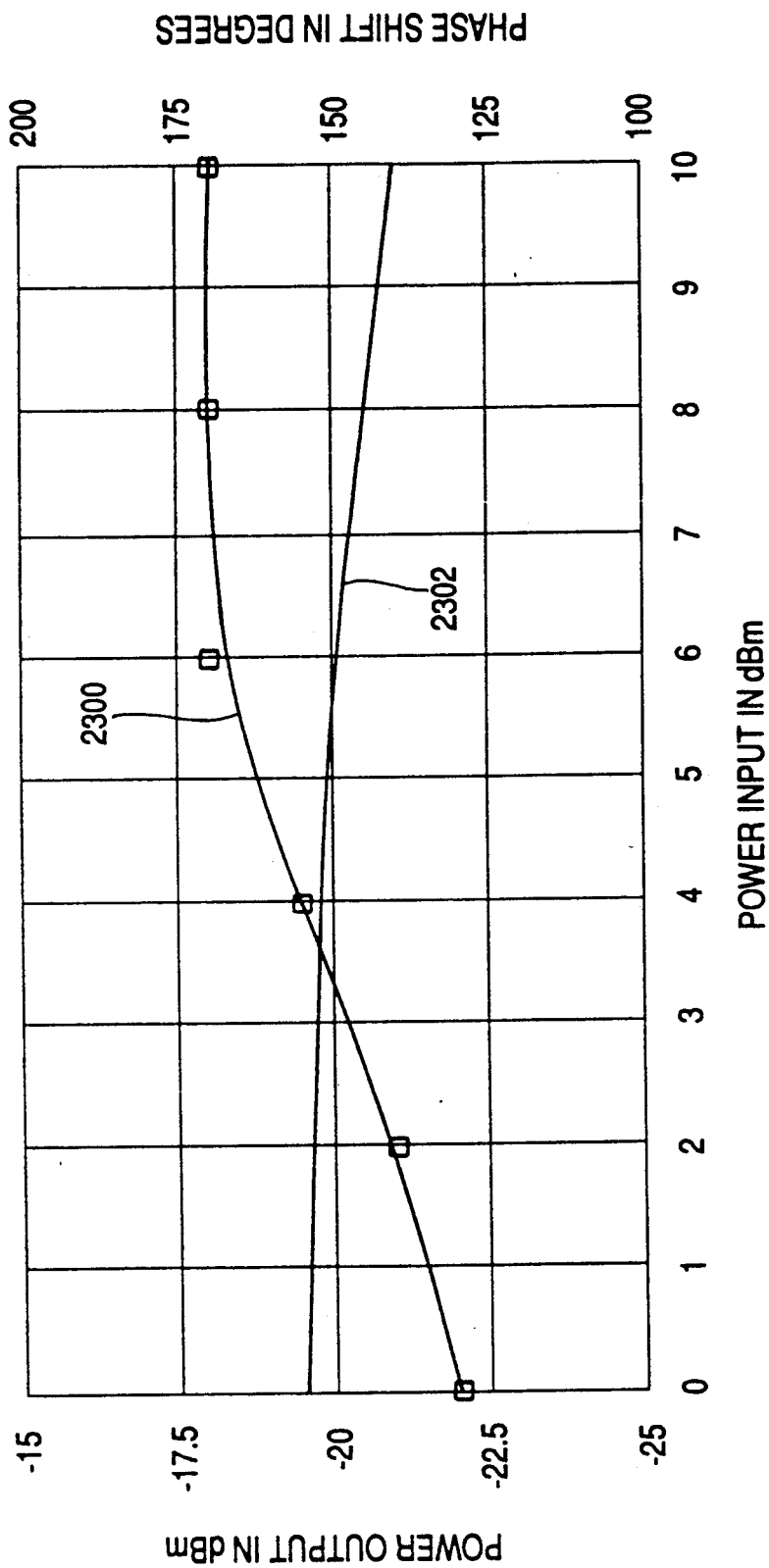
FIG. 23 plots the limiting characteristics of a transmissive FET distortion generator having the structure of FIG. 2.

FIG. 23 illustrates as a plot 2300 the amplitude response of a transmission type distortion generator, such as that of FIG. 2, at 12 GHz. The limiting characteristic is evident above about 6 dBm input. The corresponding phase characteristic is plotted as 2302.

Other embodiments of the invention will be apparent to those skilled in the art. For example, the gate-to-ground impedance such as 102 may include complex networks of inductors, capacitors, resistors or their distributed equivalents, so long as suitable bias voltage can be applied. The bias voltage can be applied to the gate electrode through gate impedance 102. Gate impedance 102 may not be necessary at all in some cases, the impedance to ground of the gate bias source being sufficient. As mentioned in conjunction with FIG. 2, a direct-current path between a source of reference potential and one of source or drain electrodes 82, 84 is necessary in order to apply voltage between gate and source-to-drain path 88; this direct-current path may be provided by a DC restorer circuit even if the paths are interrupted by blocking capacitors. Where ground or short-circuit connections are referred to, those skilled in the art recognize that for AC purposes, only a low AC impedance to ground is necessary, and the direct potential at the connection is irrelevant. While a short-circuit is ordinarily used as a reflective element, in certain situations, particularly for low-impedance systems, an open-circuit may provide a similar function.

What is claimed is:

1. A circuit for, within a particular frequency range, distorting at least one of (a) amplitude and (b) phase of signal to be distorted, said circuit comprising:

a FET including a gate electrode, and also including source and drain electrodes and a controllable path for the flow of signal therebetween;

bias means coupled to said gate electrode and to at least one of said source and drain electrodes for applying bias voltage to said gate electrode for controlling said FET for distortion of signals traversing said controllable path;

reactance means coupled between said gate electrode and a point of reference potential, said reactance means being selected to have a range of values, within said particular frequency range, for coacting with said bias for controlling said FET for distortion of said signals traversing said controllable path; and coupling means for coupling said signal to be distorted to one of said source and drain electrodes for causing said signal to traverse said controllable path at least once, and for coupling the resulting distorted signal to utilization means.

2. A circuit according to claim 1, wherein said first transmission path of said coupling means further comprises a first path for the flow of said signal to be distorted to said one of said source and drain electrodes, and a second path for the flow of distorted signal from said one of said source and drain electrodes to said utilization means.

3. A circuit according to claim 2 wherein said second transmission path comprises a circulator.

4. A circuit according to claim 2 wherein said second transmission path comprises a hybrid circuit.

5. A predistortion equalizer for an alternating signal to be predistorted, comprising:
   signal dividing and combining means including an input port adapted to be coupled to receive signal to be predistorted, a predistortion output port, and at least third and fourth ports, for dividing said signal to be predistorted into first and second signal portions, and for combining signals applied to said third and fourth ports to produce a predistorted signal at said predistortion output port;
   linear operating means coupled to at least said third port of said signal dividing and combining means for receiving said first signal portion from said signal dividing and combining means, for operating linearly on said first signal portion to produce a linear signal component, and for applying said linear signal component to said third port of said signal dividing and combining means;
   a field-effect transistor including gate, source and drain electrode;
   coupling means coupled to at least said fourth port of said signal dividing and combining means and to one of said source and drain electrodes of said field-effect transistor, for coupling said second signal portion to said field-effect transistor, and for coupling distorted signal from said field-effect transistor to said fourth port of said signal dividing and combining means, whereby said distorted signal and said linear signal component are combined to produce said predistorted signal at said predistortion output port of said signal dividing and combining means.

6. An equalizer according to claim 5 wherein:
   said signal dividing and combining means comprises signal splitting means including said input port adapted to receive signal to be predistorted, and also comprises output fifth and sixth ports, for dividing said signal to be predistorted into said first and second signal portions at said fifth and sixth ports, respectively;
   said signal dividing and combining means further comprises signal combining means including said predistortion output port and said third and fourth ports, for combining signals applied to said third and fourth ports to produce said predistorted signal at said predistortion output port;
   said linear operating means comprises a linear transmission path extending between said fifth port and said third port for coupling said first signal portion from said fifth port to said third port; and
   said coupling means comprises a second transmission path extending between said sixth port and said one of said source and drain electrodes for applying said second signal portion to said field-effect transistor, and also comprises a third transmission path extending between one of said source and drain electrodes and said fourth port for coupling said distorted signal from said field-effect transistor to said signal combining means.

7. An equalizer according to claim 6 wherein said third transmission path extends between said fourth port and that one of said source and drain electrodes of said field-effect transistor to which said first transmission path is not coupled.

8. An equalizer according to claim 7 further comprising:
   a source of reference potential; and
   impedance means coupled between said gate electrode and said source of reference potential.

9. An equalizer according to claim 7 further comprising bias means coupled to said gate electrode for biasing said field-effect transistor for nonlinear operation.

10. An equalizer according to claim 6 wherein said third transmission path extends between said fourth port and said one of said source and drain electrodes to which said second transmission path is coupled.

11. An equalizer according to claim 10 further comprising:
   a source of reference potential; and
   second coupling means coupled to said source of reference potential and to the other of said source and drain electrodes.

12. An equalizer according to claim 11 wherein said second coupling means has an impedance which is substantially zero in magnitude.

13. An equalizer according to claim 11 further comprising:
   impedance means coupled between said gate electrode and said source of reference potential.

14. An equalizer according to claim 13 further comprising bias means coupled to said gate electrode for biasing said field-effect transistor for nonlinear operation.

15. An equalizer according to claim 5 wherein:
   said signal dividing and combining means includes a hybrid circuit for propagating said first signal portion from said third port and for propagating said second signal portion from said fourth port;
   said linear operating means includes a linear reflective circuit coupled to said third port for receiving said first signal portion from said third port and for reflecting said linear signal component thereto;
   said field-effect transistor is coupled as part of a reflective circuit; and
   said coupling means comprises transmissive means extending between said fourth port and said one of said source and drain electrodes for applying said second signal portion to said field-effect transistor and for coupling said distorted signal from said field-effect transistor to said fourth port.

16. An equalizer according to claim 15 further comprising a source of reference potential; and
   wherein the other of said source and drain electrodes is coupled to said source of reference potential.

17. An equalizer according to claim 16 further comprising:
   impedance means coupled between said gate electrode and said source of reference potential.

18. An equalizer according to claim 16 further comprising bias means coupled to said gate electrode for biasing said field-effect transistor for nonlinear operation.

19. A predistortion equalizer for an alternating signal to be predistorted, comprising:
   signal dividing means adapted to be coupled to a source of said signal to be predistorted, and including first and second output ports, for dividing said signal to be predistorted into first and second portions and for making said first and second signal portions available at said first and second output ports, respectively, of said signal dividing means;
   signal combining means, including first and second input ports and an output port, for linearly combining signals applied to said first and second input ports of said signal combining means;
   first linear coupling means coupled to said first output port of said signal dividing means and to said first input port of said signal combining means for coupling said first portion without substantial nonlinear distortion;
   a field-effect transistor including gate, source and drain electrodes;
   second linear coupling means coupled to said second output port of said signal dividing means and to one of said source and drain electrodes of said field-effect transistor for coupling said second signal portion to said one of said source and drain electrodes;
   bias means coupled to at least said gate electrode for biasing said field-effect transistor into a nonlinear operating region, whereupon said field-effect transistor associates distortion signal components with said second signal portion to produce a first distorted signal;
   third linear coupling means coupled to said second input port of said signal combining means and to one of said source and drain electrodes of said field-effect transistor for coupling said first distorted signal to said signal combining means for combination with said first signal portion to produce a predistorted signal; and
   phase control means associated with at least one of said first, second and third linear coupling means for introducing relative phase shifts between said first signal portion and said distorted signal for controlling predistortion of said predistorted signal.

20. An equalizer according to claim 19 wherein both said second and third linear coupling means are coupled to the same one of said source and drain electrodes, and further comprising:
   a source of reference potential; and
   fourth coupling means coupled to said source of reference potential and to the other one of said source and drain electrodes.

21. An equalizer according to claim 20 wherein said fourth coupling means comprises reactive means having a reactance at a frequency of operation.

22. An equalizer according to claim 19, wherein
   said signal dividing means comprises a first section of a four-port hybrid circuit including an input port, an output port and first and second input-output ports, said first section including said input port and said first and second output ports of said hybrid circuit, said input port of said hybrid circuit being adapted to be coupled to said source of said signal to be predistorted, and said first and second signal portions being made available at said first and second input-output ports, respectively; and wherein
   said signal combining means comprises a second section of said hybrid circuit including said output port and said first and second input-output ports, said predistorted signal being generated at said output port of said hybrid circuit, and said first and second input-output ports being coupled for receiving said first portion and said distorted signal, respectively; and wherein
   said second linear coupling means comprises means for providing signal flow in a first direction through a transmission path, and said third linear coupling means comprises means for providing signal flow in a second direction through said transmission path.

23. An equalizer according to claim 19, wherein said third linear coupling means is coupled to that one of said source and drain electrodes of said field-effect transistor to which said second linear coupling means is not coupled.

24. An equalizer according to claim 23, further comprising:
   a source of reference potential; and
   coupling means coupled to said source of reference potential and to said gate electrode of said field-effect transistor means, said coupling means comprising a component which has a reactive characteristic at a frequency of operation.

25. A predistortion equalizer, comprising:
   a hybrid circuit including an input port adapted to be coupled to a source of signal to be predistorted, and also including an output port at which predistorted signals are generated, said hybrid circuit further including first and second input-output ports at which equal-amplitude reference-phase and 90°-phase, respectively, samples of said signal to be predistorted appear when said signals to be predistorted are applied to said input port of said hybrid circuit, and to which signals may be applied for coupling to said output port of said hybrid circuit;
   linear, reflective means coupled to said first input-output port of said hybrid circuit for linearly reflecting said reference-phase samples of said signal to be predistorted back to said first input-output port of said hybrid circuit for coupling therefrom to said port of said hybrid circuit;
   a field-effect transistor including gate, source and drain electrodes, one of said source and drain electrodes being coupled to said second input-output port for receiving said 90°-phase sample of said signal to be predistorted; and
   bias means coupled to at least said gate electrode of said field-effect transistor for biasing said field-effect transistor for nonlinear operation, whereby said 90° phase sample of said signal is nonlinearly reflected to said second input-output port of said hybrid circuit for coupling to said output port of said hybrid circuit combined with said reflected reference-phase sample.

26. An equalizer according to claim 25 further comprising:
   a source of reference potential; and
   further coupling means coupled to the other of said source and drain electrodes of said field-effect transistor and to said source of reference potential.

27. An equalizer according to claim 26 wherein said further coupling means comprises a short-circuit.

28. An equalizer according to claim 26 further comprising a source of reference potential, and further comprising impedance means coupled to said gate electrode of said field-effect transistor and to said source of reference potential.

29. An equalizer according to claim 28 wherein said impedance means includes a reactive component.

30. A predistortion equalizer, comprising:
a circulator including an input port, a second port coupled for receiving signals applied to said first input port but not for transmitting signals thereto, and further including an output port coupled for receiving signals applied to said second port but not those applied to said first port, said input port being adapted to be coupled to a source of signals to be predistorted;
a field-effect transistor including gate, source and drain electrodes, one of said source and drain electrodes being coupled to said second port of said circulator for receiving said signals to be predistorted therefrom, and for nonlinearly reflecting in order to apply a distorted signal to said second port of said circulator for coupling said distorted signal to said output port of said circulator.

31. An equalizer according to claim 30, further comprising:
a source of reference potential; and
impedance means coupled to said gate electrode and to said source of reference potential.

32. An equalizer according to claim 30, further comprising:
a source of reference potential; and
means for coupling the other of said source and drain electrodes to said source of reference potential.

33. An equalizer according to claim 30 further comprising:
bias means coupled to at least said gate electrode for biasing said field-effect transistor.

34. A circuit for distorting at least one of (a) amplitude and (b) phase of signal to be distorted, comprising:
a FET including a gate electrode, and also including source and drain electrodes and a controllable path for the flow of signal therebetween;
bias means coupled to said gate electrode and to at least one of said source and drain electrodes for applying bias voltage to said gate electrode for controlling said FET for distortion of signals traversing said controllable path; and
coupling means for coupling signals to be distorted to said FET and for coupling the resulting distorted signal to utilization means, said coupling means including a first transmission path for coupling signals to be distorted to one of said source and drain electrodes for causing said signal to traverse said controllable path a first time, said coupling means further including a second transmission path short-circuiting the other one of said source and drain electrodes for causing reflection and a second traversal of said controllable path by said signal.

* * * * *

UNITED STATES PATENT AND TRADEMARK OFFICE
CERTIFICATE OF CORRECTION

PATENT NO. : 5,038,113

DATED : August 6, 1991

INVENTOR(S) : Allen Katz, et al.

It is certified that error appears in the above-identified patent and that said Letters Patent is hereby corrected as shown below:

Column 2, line 31, "9020" should read --90°--

Column 7, line 65, "72" should read --720--

Signed and Sealed this

Twenty-ninth Day of December, 1992

Attest:

DOUGLAS B. COMER

Attesting Officer

Acting Commissioner of Patents and Trademarks